United States Patent
Liu et al.

(10) Patent No.: US 10,271,457 B2
(45) Date of Patent: Apr. 23, 2019

(54) HEAT DISSIPATION APPARATUS, HEAT DISSIPATION CONTROL METHOD, AND CONTROLLER

(71) Applicant: Huawei Technologies Co., Ltd., Shenzhen (CN)

(72) Inventors: Yunju Liu, Yokohama (JP); Junfeng Ding, Shenzhen (CN); Yao Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 139 days.

(21) Appl. No.: 15/368,038

(22) Filed: Dec. 2, 2016

(65) Prior Publication Data
US 2017/0086331 A1 Mar. 23, 2017

Related U.S. Application Data

(63) Continuation of application No. PCT/CN2015/070095, filed on Jan. 5, 2015.

(30) Foreign Application Priority Data

Jun. 3, 2014 (CN) .......................... 2014 1 0243367

(51) Int. Cl.
*H05K 7/20* (2006.01)
*F24F 3/08* (2006.01)
(Continued)

(52) U.S. Cl.
CPC .......... *H05K 7/20281* (2013.01); *F24F 1/24* (2013.01); *F24F 3/08* (2013.01); *H05K 7/20* (2013.01);
(Continued)

(58) Field of Classification Search
CPC ............. H05K 7/2029; H05K 7/20281; H05K 7/20781; F24F 3/08; F24F 2140/12; F24F 1/24
(Continued)

(56) References Cited

U.S. PATENT DOCUMENTS

| 5,540,555 A | * | 7/1996 | Corso | ..................... E03B 11/00 |
| | | | | 137/565.16 |
| 7,028,768 B2 | * | 4/2006 | Aler | ......................... F24F 3/06 |
| | | | | 165/101 |

(Continued)

FOREIGN PATENT DOCUMENTS

| CN | 102566605 A | 7/2012 |
| CN | 103033219 A | 4/2013 |

(Continued)

OTHER PUBLICATIONS

Foreign Communication From A Counterpart Application, Chinese Application No. 201410243367.6, Chinese Office Action dated Feb. 22, 2016, 5 pages.

(Continued)

*Primary Examiner* — Cassey D Bauer
*Assistant Examiner* — Jenna M Hopkins
(74) *Attorney, Agent, or Firm* — Conley Rose, P.C.

(57) ABSTRACT

A heat dissipation controller is connected to a sensor and a water pump such that the controller correspondingly adjusts the water pump according to the current pressure difference and a preset pressure difference, to control a flow capacity of coolant flowing into a branch water pipe, until an absolute value of a difference between the current pressure difference and the preset pressure difference is less than or equal to a preset error amount. The controller can adjust the flow capacity of the coolant flowing into the branch water pipe to effectively ensure that flow capacities of coolant in all (Continued)

branch water pipes are distributed evenly, and to effectively improve stability of the heat dissipation apparatus.

16 Claims, 9 Drawing Sheets

(51) Int. Cl.
*F24F 1/24* (2011.01)
*F24F 140/12* (2018.01)

(52) U.S. Cl.
CPC ..... H05K 7/20272 (2013.01); H05K 7/20781 (2013.01); H05K 7/20836 (2013.01); *F24F 2140/12* (2018.01)

(58) Field of Classification Search
USPC .......................... 165/282, 140.33; 62/259.2
See application file for complete search history.

(56) References Cited

U.S. PATENT DOCUMENTS

| | | | | |
|---|---|---|---|---|
| 8,011,200 | B2* | 9/2011 | Spearing | H05K 7/20281 62/259.2 |
| 9,167,721 | B2* | 10/2015 | Campbell | H05K 7/20281 |
| 9,769,954 | B2* | 9/2017 | Bonnin | H05K 7/20218 |
| 2007/0227708 | A1* | 10/2007 | Hom | G06F 1/20 165/121 |
| 2010/0078160 | A1 | 4/2010 | Novotny et al. | |
| 2011/0056225 | A1* | 3/2011 | Campbell | F28D 15/0266 62/208 |
| 2011/0056675 | A1* | 3/2011 | Barringer | H05K 7/20736 165/299 |
| 2012/0026691 | A1* | 2/2012 | Campbell | H05K 7/20781 361/700 |
| 2012/0180979 | A1* | 7/2012 | Harrington | F28D 1/0246 165/11.1 |
| 2013/0133873 | A1* | 5/2013 | Campbell | H05K 7/20281 165/281 |
| 2013/0138253 | A1* | 5/2013 | Chainer | G05D 7/0635 700/282 |
| 2013/0345893 | A1* | 12/2013 | David | G05D 23/00 700/300 |
| 2014/0060798 | A1* | 3/2014 | Eckberg | G05D 23/1932 165/287 |
| 2014/0102672 | A1* | 4/2014 | Campbell | H05K 7/20836 165/104.33 |
| 2014/0209288 | A1* | 7/2014 | Simon | H05K 7/20836 165/281 |
| 2014/0238065 | A1* | 8/2014 | Bonnin | H05K 7/20218 62/259.2 |
| 2014/0284041 | A1* | 9/2014 | Kawano | F04B 49/065 165/281 |
| 2015/0296659 | A1* | 10/2015 | Desiano | H05K 7/20772 361/701 |

FOREIGN PATENT DOCUMENTS

| | | | | |
|---|---|---|---|---|
| CN | 103092223 A | 5/2013 | | |
| CN | 104039117 A | 9/2014 | | |
| EP | 2790480 A2 * | 10/2014 | ......... | H05K 7/20927 |
| WO | 2010039773 A1 | 4/2010 | | |

OTHER PUBLICATIONS

Foreign Communication From A Counterpart Application, PCT Application No. PCT/CN2015/070095, English Translation of International Search Report dated Mar. 23, 2015, 2 pages.
Foreign Communication From A Counterpart Application, PCT Application No. PCT/CN2015/070095, English Translation of Written Opinion dated Mar. 23, 2015, 8 pages.
Foreign Communication From A Counterpart Application, European Application No. 15803715.0, Extended European Search Report dated Jul. 26, 2017, 9 pages.

* cited by examiner

US 10,271,457 B2

HEAT DISSIPATION APPARATUS, HEAT DISSIPATION CONTROL METHOD, AND CONTROLLER

CROSS-REFERENCE TO RELATED APPLICATIONS

This application is a continuation of International Application No. PCT/CN2015/070095, filed on Jan. 5, 2015, which claims priority to Chinese Patent Application No. 201410243367.6, filed on Jun. 3, 2014. The disclosures of the aforementioned applications are hereby incorporated by reference in their entireties.

TECHNICAL FIELD

The present disclosure relates to the field of cooling of communications devices, and in particular, to a heat dissipation apparatus, a heat dissipation control method, and a controller.

BACKGROUND

As sizes of electronic parts and components decrease continuously and performance and speeds of the electronic parts and components improve gradually, energy consumption and heating power consumption of chips are increasingly high. Heat dissipation condition of the electronic parts and components and temperature evenness on surfaces of the electronic parts and components directly affect performance and long-term reliability of the electronic parts and components. A fan heat sink is a conventional heat dissipation manner. With information and communication technologies fusion, as power consumption of communications devices increases continuously, fan cooling is improved in aspects such as a rotation speed and a size. However, for fan cooling, a heat dissipation capability cannot be enhanced without limit, and a conspicuous noise problem arises. Therefore, development of a liquid cooling technology can make up such a disadvantage. Currently, the liquid cooling technology has been applied in multiple fields such as data centers, servers, and personal computers (PCs).

An existing heat dissipation apparatus mainly includes a main water pipe and multiple branch water pipes connected to the main water pipe, where boards are mounted on the branch water pipes.

However, when a board is mounted on a branch water pipe or a board is removed from a branch water pipe, a flow capacity of coolant in the main water pipe cannot be controlled. If there is a small quantity of boards, a flow capacity of coolant flowing through each board is relatively large. In this case, a proportional valve needs to be controlled to adjust temperature of coolant in the branch water pipe, so as to change the temperature relatively greatly. A relatively large temperature change results in problems of decreasing performance and service life of the heat dissipation apparatus, reducing stability of the heat dissipation apparatus.

SUMMARY

Embodiments of the present disclosure provide a heat dissipation apparatus, a heat dissipation control method, and a controller, which can effectively improve heat dissipation performance of the heat dissipation apparatus and can improve stability of the heat dissipation apparatus.

A first aspect of the embodiments of the present disclosure provides a heat dissipation apparatus, including a main water pipe, a branch water pipe, a water pump, a sensor, and a controller, where the branch water pipe is connected to the main water pipe, and the branch water pipe is configured to cool a board mounted on the branch water pipe; the water pump is disposed on the main water pipe; the sensor is disposed on the main water pipe or the branch water pipe, and the sensor is configured to obtain inflow pressure of coolant flowing into the branch water pipe and outflow pressure of coolant flowing out of the branch water pipe; and the controller is connected to the sensor, so that the controller determines a current pressure difference between the inflow pressure and the outflow pressure; and the controller is further connected to the water pump, so that the controller correspondingly adjusts the water pump according to the current pressure difference and a preset pressure difference, to control a flow capacity of the coolant flowing into the branch water pipe, until an absolute value of a difference between the current pressure difference and the preset pressure difference is less than or equal to a preset error amount, where an initial pressure difference is a pressure difference required for ensuring that each component on the board runs without derating, and the preset pressure difference is a maximum value of the initial pressure differences of every two boards of the multiple boards.

With reference to the first aspect of the embodiments of the present disclosure, in a first implementation manner of the first aspect of the embodiments of the present disclosure, a value range of the preset error amount is greater than or equal to 0, and is less than or equal to 10% of the preset pressure difference.

With reference to the first aspect of the embodiments of the present disclosure, in a second implementation manner of the first aspect of the embodiments of the present disclosure, the main water pipe includes an inflow pipe and a backflow pipe; the branch water pipe includes a flow dividing pipe, a flow collecting pipe, and multiple parallelly disposed branch pipes; the flow dividing pipe is connected to both the inflow pipe and the branch pipes, so that coolant in the inflow pipe flows into the branch pipes evenly through the flow dividing pipe; and the flow collecting pipe is connected to both the backflow pipe and the branch pipes, so that coolant in the branch pipes flows into the backflow pipe evenly through the flow collecting pipe.

With reference to the second implementation manner of first aspect of the embodiments of the present disclosure, in a third implementation manner of the first aspect of the embodiments of the present disclosure, the sensor is a pressure sensor or a differential pressure sensor.

With reference to the third implementation manner of first aspect of the embodiments of the present disclosure, in a fourth implementation manner of the first aspect of the embodiments of the present disclosure, the pressure sensor includes a first pressure sensor and a second pressure sensor, where the first pressure sensor is disposed on the inflow pipe or the flow dividing pipe, and is configured to obtain inflow pressure of coolant flowing into the flow dividing pipe; and the second pressure sensor is disposed on the backflow pipe or the flow collecting pipe, and is configured to obtain outflow pressure of coolant flowing out of the flow collecting pipe; and the controller is connected to both the first pressure sensor and the second pressure sensor, and the controller is configured to calculate the current pressure difference according to the inflow pressure that has been obtained by the first pressure sensor and the outflow pressure that has been obtained by the second pressure sensor.

With reference to the third implementation manner of first aspect of the embodiments of the present disclosure, in a fifth implementation manner of the first aspect of the embodiments of the present disclosure, the differential pressure sensor includes a first pressure interface, a second pressure interface, and a calculation module, where the first pressure interface is disposed on the inflow pipe or the flow dividing pipe, and is configured to obtain inflow pressure of coolant flowing into the flow dividing pipe; the second pressure interface is disposed on the backflow pipe or the flow collecting pipe, and is configured to obtain outflow pressure of coolant flowing out of the flow collecting pipe; and the calculation module is connected to both the first pressure interface and the second pressure interface, and the calculation module is configured to calculate a difference between the inflow pressure and the outflow pressure; and the controller is connected to the differential pressure sensor, and the controller is configured to obtain the difference between the inflow pressure and the outflow pressure that has been calculated by the calculation module, where the difference is the current pressure difference.

With reference to the second implementation manner of first aspect of the embodiments of the present disclosure, in a sixth implementation manner of the first aspect of the embodiments of the present disclosure, a flowmeter is disposed on the inflow pipe or the backflow pipe, and the flowmeter is configured to obtain a current flow capacity of coolant in the main water pipe; and the controller is connected to the flowmeter, and the controller is configured to determine a fully loaded flow capacity, where the fully loaded flow capacity is a flow capacity, of the coolant in the main water pipe, existing when the absolute value of the difference between the current pressure difference and the preset pressure difference is less than or equal to the preset error amount and a board that meets a preset condition is mounted on each of the branch pipes, and the preset condition is that the initial pressure difference that has been set for the board mounted on the branch pipe is less than or equal to the preset pressure difference; the controller is further configured to obtain the current flow capacity and determine that a quotient of the fully loaded flow capacity and a total quantity of the branch pipes is a branch flow capacity, and the controller determines a quotient of a difference between the fully loaded flow capacity and the current flow capacity and the branch flow capacity, and determines whether the quotient of the difference between the fully loaded flow capacity and the current flow capacity and the branch flow capacity is an integer; and if yes, the controller determines that the quotient is a quantity of boards that are additionally mountable on the branch pipes and that meet the preset condition, or if no, the controller determines that an integer part of the quotient is a quantity of boards that are additionally mountable on the branch pipes and that meet the preset condition.

A second aspect of the embodiments of the present disclosure provides a heat dissipation control method, including determining, by a controller, a current pressure difference between inflow pressure and outflow pressure, where the inflow pressure is pressure of coolant flowing into a branch water pipe, the outflow pressure is pressure of coolant flowing out of the branch water pipe, the inflow pressure and the outflow pressure are obtained by a sensor, and the branch water pipe is configured to cool a board mounted on the branch water pipe; determining, by the controller, a maximum value of initial pressure differences of every two boards as a preset pressure difference, where the initial pressure difference is a pressure difference required for ensuring that each component on the board runs without derating; and correspondingly adjusting, by the controller, a water pump according to the current pressure difference and the preset pressure difference, to control a flow capacity of the coolant flowing into the branch water pipe, until an absolute value of a difference between the current pressure difference and the preset pressure difference is less than or equal to a preset error amount, where the water pump is disposed on a main water pipe connected to the branch water pipe.

With reference to the second aspect of the embodiments of the present disclosure, in a first implementation manner of the second aspect of the embodiments of the present disclosure, the determining, by a controller, a current pressure difference between inflow pressure and outflow pressure includes obtaining, by the controller, the inflow pressure that has been obtained by a first pressure sensor, where the first pressure sensor is configured to obtain the inflow pressure; obtaining, by the controller, the outflow pressure that has been obtained by a second pressure sensor, where the second pressure sensor is configured to obtain the outflow pressure; and calculating, by the controller, the current pressure difference according to the inflow pressure that has been obtained by the first pressure sensor and the outflow pressure that has been obtained by the second pressure sensor, where the main water pipe includes an inflow pipe and a backflow pipe; the branch water pipe includes a flow dividing pipe, a flow collecting pipe, and multiple parallelly disposed branch pipes; the flow dividing pipe is connected to both the inflow pipe and the branch pipes, so that coolant in the inflow pipe flows into the branch pipes evenly through the flow dividing pipe; and the flow collecting pipe is connected to both the backflow pipe and the branch pipes, so that coolant in the branch pipes flows into the backflow pipe evenly through the flow collecting pipe; and the sensor includes the first pressure sensor and the second pressure sensor, where the first pressure sensor is disposed on the inflow pipe or the flow dividing pipe, and is configured to obtain inflow pressure of coolant flowing into the flow dividing pipe; and the second pressure sensor is disposed on the backflow pipe or the flow collecting pipe, and is configured to obtain outflow pressure of coolant flowing out of the flow collecting pipe.

With reference to the second aspect of the embodiments of the present disclosure, in a second implementation manner of the second aspect of the embodiments of the present disclosure, the main water pipe includes an inflow pipe and a backflow pipe; the branch water pipe includes a flow dividing pipe, a flow collecting pipe, and multiple parallelly disposed branch pipes; the flow dividing pipe is connected to both the inflow pipe and the branch pipes, so that coolant in the inflow pipe flows into the branch pipes evenly through the flow dividing pipe; the flow collecting pipe is connected to both the backflow pipe and the branch pipes, so that coolant in the branch pipes flows into the backflow pipe evenly through the flow collecting pipe; the sensor is a differential pressure sensor, and the differential pressure sensor includes a first pressure interface, a second pressure interface, and a calculation module, where the first pressure interface is disposed on the inflow pipe, and is configured to obtain inflow pressure of coolant flowing into the flow dividing pipe; the second pressure interface is disposed on the backflow pipe, and is configured to obtain outflow pressure of coolant flowing out of the flow collecting pipe; and the first calculation module is connected to both the first pressure interface and the second pressure interface, and the first calculation module is configured to calculate a difference between the inflow pressure and the outflow pressure;

and the determining, by a controller, a current pressure difference between inflow pressure and outflow pressure includes obtaining, by the controller, the difference between the inflow pressure and the outflow pressure that has been calculated by the calculation module; and determining, by the controller, that the difference is the current pressure difference.

With reference to the second aspect of the embodiments of the present disclosure, in a third implementation manner of the second aspect of the embodiments of the present disclosure, the main water pipe includes an inflow pipe and a backflow pipe; the branch water pipe includes a flow dividing pipe, a flow collecting pipe, and multiple parallelly disposed branch pipes; the flow dividing pipe is connected to both the inflow pipe and the branch pipes, so that coolant in the inflow pipe flows into the branch pipes evenly through the flow dividing pipe; and the flow collecting pipe is connected to both the backflow pipe and the branch pipes, so that coolant in the branch pipes flows into the backflow pipe evenly through the flow collecting pipe; and the method further includes determining, by the controller, a fully loaded flow capacity, where the fully loaded flow capacity is a flow capacity, of coolant in the main water pipe, existing when the absolute value of the difference between the current pressure difference and the preset pressure difference is less than or equal to the preset error amount and a board that meets a preset condition is mounted on each of the branch pipes, and the preset condition is that the initial pressure difference that has been set for the board mounted on the branch pipe is less than or equal to the preset pressure difference; obtaining, by the controller, a current flow capacity of the coolant in the main water pipe, where the current flow capacity is obtained by a flowmeter disposed on the inflow pipe or the backflow pipe; determining, by the controller, that a quotient of the fully loaded flow capacity and a total quantity of the branch pipes is a branch flow capacity; determining, by the controller, a quotient of a difference between the fully loaded flow capacity and the current flow capacity and the branch flow capacity; and determining whether the quotient of the difference between the fully loaded flow capacity and the current flow capacity and the branch flow capacity is an integer; and if yes, determining, by the controller, that the quotient is a quantity of boards that are additionally mountable on the branch pipes and that meet the preset condition; or if no, determining, by the controller, that an integer part of the quotient is a quantity of boards that are additionally mountable on the branch pipes and that meet the preset condition.

A third aspect of the embodiments of the present disclosure provides a heat controller, including a first determining unit configured to determine a current pressure difference between inflow pressure and outflow pressure, where the inflow pressure is pressure of coolant flowing into a branch water pipe, the outflow pressure is pressure of coolant flowing out of the branch water pipe, the inflow pressure and the outflow pressure are obtained by a sensor, and the branch water pipe is configured to cool a board mounted on the branch water pipe; a second determining unit configured to determine a maximum value of initial pressure differences of every two boards as a preset pressure difference, where the initial pressure difference is a pressure difference required for ensuring that each component on the board runs without derating; and an adjustment unit configured to correspondingly adjust a water pump according to the current pressure difference and the preset pressure difference, to control a flow capacity of the coolant flowing into the branch water pipe, until an absolute value of a difference between the current pressure difference and the preset pressure difference is less than or equal to a preset error amount, where the water pump is disposed on a main water pipe connected to the branch water pipe.

With reference to the third aspect of the embodiments of the present disclosure, in a first implementation manner of the third aspect of the embodiments of the present disclosure, the first determining unit includes a first obtaining module configured to obtain the inflow pressure that has been obtained by a first pressure sensor, where the first pressure sensor is configured to obtain the inflow pressure; a second obtaining module configured to obtain the outflow pressure that has been obtained by a second pressure sensor, where the second pressure sensor is configured to obtain the outflow pressure; and a calculation module configured to calculate the current pressure difference according to the inflow pressure that has been obtained by the first pressure sensor and the outflow pressure that has been obtained by the second pressure sensor, where the main water pipe includes an inflow pipe and a backflow pipe; the branch water pipe includes a flow dividing pipe, a flow collecting pipe, and multiple parallelly disposed branch pipes; the flow dividing pipe is connected to both the inflow pipe and the branch pipes, so that coolant in the inflow pipe flows into the branch pipes evenly through the flow dividing pipe; the flow collecting pipe is connected to both the backflow pipe and the branch pipes, so that coolant in the branch pipes flows into the backflow pipe evenly through the flow collecting pipe; the sensor includes the first pressure sensor and the second pressure sensor; the first pressure sensor is disposed on the inflow pipe or the flow dividing pipe, and is configured to obtain inflow pressure of coolant flowing into the flow dividing pipe; and the second pressure sensor is disposed on the backflow pipe or the flow collecting pipe, and is configured to obtain outflow pressure of coolant flowing out of the flow collecting pipe.

With reference to the third aspect of the embodiments of the present disclosure, in a second implementation manner of the third aspect of the embodiments of the present disclosure, the main water pipe includes an inflow pipe and a backflow pipe; the branch water pipe includes a flow dividing pipe, a flow collecting pipe, and multiple parallelly disposed branch pipes; the flow dividing pipe is connected to both the inflow pipe and the branch pipes, so that coolant in the inflow pipe flows into the branch pipes evenly through the flow dividing pipe; the flow collecting pipe is connected to both the backflow pipe and the branch pipes, so that coolant in the branch pipes flows into the backflow pipe evenly through the flow collecting pipe; the sensor is a differential pressure sensor, and the differential pressure sensor includes a first pressure interface, a second pressure interface, and a calculation module, where the first pressure interface is disposed on the inflow pipe, and is configured to obtain inflow pressure of coolant flowing into the flow dividing pipe; the second pressure interface is disposed on the backflow pipe, and is configured to obtain outflow pressure of coolant flowing out of the flow collecting pipe; and the first calculation module is connected to both the first pressure interface and the second pressure interface, and the first calculation module is configured to calculate a difference between the inflow pressure and the outflow pressure; and the first determining unit includes a third obtaining module configured to obtain the difference between the inflow pressure and the outflow pressure that has been calculated by the calculation module; and a determining module configured to determine that the difference is the current pressure difference.

With reference to the third aspect of the embodiments of the present disclosure, in a third implementation manner of the third aspect of the embodiments of the present disclosure, the main water pipe includes an inflow pipe and a backflow pipe; the branch water pipe includes a flow dividing pipe, a flow collecting pipe, and multiple parallelly disposed branch pipes; the flow dividing pipe is connected to both the inflow pipe and the branch pipes, so that coolant in the inflow pipe flows into the branch pipes evenly through the flow dividing pipe; and the flow collecting pipe is connected to both the backflow pipe and the branch pipes, so that coolant in the branch pipes flows into the backflow pipe evenly through the flow collecting pipe; and the controller further includes a third determining unit configured to determine a fully loaded flow capacity, where the fully loaded flow capacity is a flow capacity, of coolant in the main water pipe, existing when the absolute value of the difference between the current pressure difference and the preset pressure difference is less than or equal to the preset error amount and a board that meets a preset condition is mounted on each of the branch pipes, and the preset condition is that the initial pressure difference that has been set for the board mounted on the branch pipe is less than or equal to the preset pressure difference; an obtaining unit configured to obtain a current flow capacity of the coolant in the main water pipe, where the current flow capacity is obtained by a flowmeter disposed on the inflow pipe or the backflow pipe; a fourth determining unit configured to determine that a quotient of the fully loaded flow capacity and a total quantity of the branch pipes is a branch flow capacity; a fifth determining unit configured to determine a quotient of a difference between the fully loaded flow capacity and the current flow capacity and the branch flow capacity; and determine whether the quotient of the difference between the fully loaded flow capacity and the current flow capacity and the branch flow capacity is an integer; and a sixth determining unit configured to if the fifth determining unit determines that the quotient of the difference between the fully loaded flow capacity and the current flow capacity and the branch flow capacity is an integer, determine that the quotient is a quantity of boards that are additionally mountable on the branch pipes and that meet the preset condition; or a seventh determining unit configured to, if the fifth determining unit determines that the quotient of the difference between the fully loaded flow capacity and the current flow capacity, and the branch flow capacity is not an integer, determine that an integer part of the quotient is a quantity of boards that are additionally mountable on the branch pipes and that meet the preset condition.

The embodiments of the present disclosure provide a heat dissipation apparatus, a heat dissipation control method, and a controller. A branch water pipe of the heat dissipation apparatus is connected to a main water pipe; a heat exchanger and a water pump are disposed on the main water pipe; a sensor is disposed on the main water pipe, and is configured to obtain inflow pressure of coolant flowing into the branch water pipe and outflow pressure of coolant flowing out of the branch water pipe; and a controller is connected to both the water pump and the sensor, and the controller is configured to adjust, according to a current pressure difference between the inflow pressure and the outflow pressure, a flow capacity of the coolant flowing into the branch water pipe. According to the embodiments of the present disclosure, the controller can adjust, according to a difference between the inflow pressure of the coolant flowing into the branch water pipe and the outflow pressure of the coolant flowing out of the branch water pipe, the flow capacity of the coolant flowing into the branch water pipe. Therefore, if a quantity of boards changes, a flow capacity of coolant in the branch water pipe can be correspondingly adjusted, thereby effectively ensuring even distribution of a flow capacity of coolant in each branch water pipe and effectively improving stability of the heat dissipation apparatus.

DETAILED DESCRIPTION

The embodiments of the present disclosure provide a heat dissipation apparatus, a heat dissipation control method, and a controller. The following describes in detail a specific structure of the heat dissipation apparatus with reference to an embodiment shown in FIG. 1.

Figure 1:
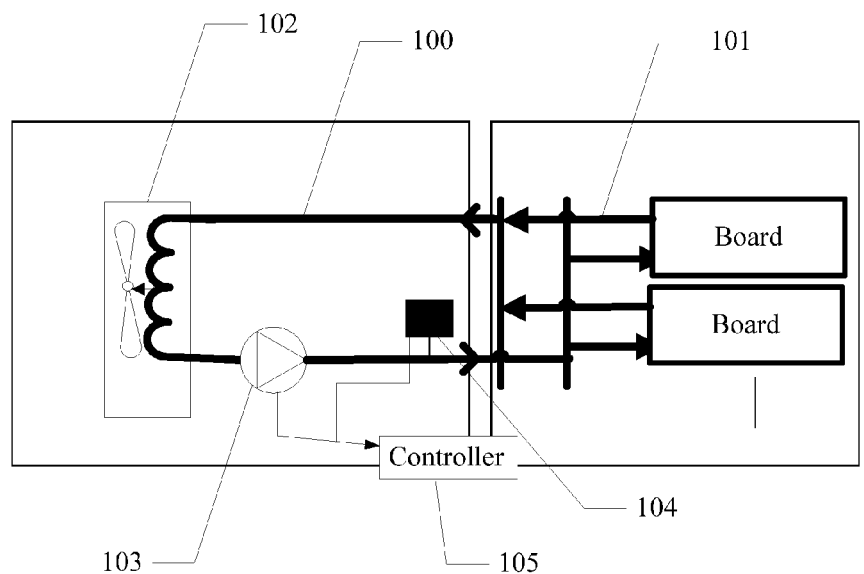
FIG. 1 is a schematic structural diagram of an embodiment of a heat dissipation apparatus according to an embodiment of the present disclosure.

The heat dissipation apparatus shown in FIG. 1 includes a main water pipe 100 and a branch water pipe 101.

The branch water pipe 101 is connected to the main water pipe 100, and coolant used to cool a board flows in the main water pipe 100 and the branch water pipe 101 circularly.

To achieve an objective of cooling a board, a heat dissipation groove is disposed on the branch water pipe 101. The board is mounted on the branch water pipe 101 by means of the heat dissipation groove, so that the branch water pipe 101 cools the board mounted on the branch water pipe 101.

Coolant in the branch water pipe 101 circulates back into the main water pipe 100 after absorbing heat of the board mounted on the branch water pipe 101. A heat exchanger 102 is further disposed on the main water pipe 101. The heat exchanger 102 can cool the coolant that is in the main water pipe 100 and that has absorbed the heat of the board. Temperature of the coolant in the main water pipe 100 is kept constant using the heat exchanger 102, which effectively avoids impact of a temperature change of the coolant on performance and service life of the heat dissipation apparatus, improving stability of the heat dissipation apparatus.

It should be clarified that in this embodiment, that the heat exchanger 102 is used to cool the main water pipe 100 is used as an example for description, and no limitation is imposed on details about how to cool the main water pipe 100.

To ensure that no relatively large temperature change occurs in the branch water pipe 101 if a quantity of boards mounted on heat dissipation grooves changes, the heat dissipation apparatus further includes a sensor 104 that is configured to obtain inflow pressure of coolant flowing into the branch water pipe 101 and outflow pressure of coolant flowing out of the branch water pipe 101.

As shown in FIG. 1, the sensor 104 is disposed on the main water pipe 100.

It should be clarified that, that the sensor 104 is disposed on the main water pipe 100 is used as an example for description, and no limitation is imposed on a specific location for disposing the sensor 104, provided that the sensor 104 can obtain the inflow pressure of the coolant flowing into the branch water pipe 101 and the outflow pressure of the coolant flowing out of the branch water pipe 101. For example, the sensor 104 may also be disposed on the branch water pipe 101.

The heat dissipation apparatus further includes a controller 105 connected to both a water pump 103 and the sensor 104.

No limitation is imposed on a specific manner of connecting the controller 105 to the water pump 103 and the sensor 104. For example, a wired connection manner may be used to ensure that a connection manner is more reliable and that a structure and performance of the heat dissipation apparatus are stable; or a wireless connection manner may be used to ensure that wiring of the heat dissipation apparatus is simple and is easy to maintain.

The controller 105 may determine a current pressure difference between the inflow pressure and the outflow pressure according to the inflow pressure and the outflow pressure.

To ensure that the controller 105 can meet, when cooling the board, heat dissipation demands of all boards mounted on the branch water pipe 101, the controller 105 needs to determine a preset pressure difference.

A specific process in which the controller 105 needs to determine the preset pressure difference is determining, by the controller 105, an initial pressure difference of each board mounted on the branch water pipe 101.

An initial pressure difference of each board is set by a manufacturer before delivery of the board, that is, before delivery, the manufacturer sets, as the initial pressure difference, a pressure difference required for ensuring that each component on the board runs without derating.

Further, in this embodiment, no limitation is imposed on a specific manner of determining, by the controller 105, the initial pressure difference of each board mounted on the branch water pipe 101. For example, the manner may be receiving, by the controller 105, an operation instruction that includes the initial pressure difference and that is input by a user, may be reading, by the controller 105, the initial pressure difference that has been stored on the board, or the like.

The controller 105 determines a maximum value of the initial pressure differences of every two boards, and determines the maximum value as the preset pressure difference.

Still further, during actual application of the heat dissipation apparatus shown in this embodiment, if the quantity of boards mounted on the branch water pipe 101 changes, when detecting that the quantity of boards changes, the controller 105 first needs to determine whether the preset pressure difference changes.

If an initial pressure difference of a board that is newly mounted on the branch water pipe 101 or detached from the branch water pipe 101 is greater than or equal to the preset pressure difference that has been determined by the controller 105, the controller 105 re-determines the preset pressure difference, and the controller 105 re-determines the preset pressure difference according to a board that is currently mounted on the branch water pipe 101.

A specific manner of re-determining the preset pressure difference by the controller 105 is as follows.

If the initial pressure difference of the newly added board is greater than the initial pressure difference that has been determined, the controller 105 may determine the initial pressure difference of the newly added board as a new preset pressure difference, so that the new preset pressure difference can meet a heat dissipation demand of the newly added board, avoiding running, with derating, of a component on the newly added board.

If the initial pressure difference of the board that is detached from the branch water pipe 101 is greater than or equal to the preset pressure difference that has been determined, the controller re-determines a maximum value of the initial pressure differences of every two boards that are currently on the branch water pipe 101, and determines the maximum value as a new preset pressure difference, so that the controller 105 meets heat dissipation demands of all boards that are currently on the branch water pipe 101, and avoids a waste of power consumed by the controller 105.

If the initial pressure difference of the board that is newly mounted on the branch water pipe 101 or detached from the branch water pipe 101 is less than or equal to the preset pressure difference that has been determined by the controller 105, the controller 105 does not need to re-determine the preset pressure difference.

If the initial pressure difference of the board that is newly mounted on the branch water pipe 101 or detached from the branch water pipe 101 is less than the preset pressure difference, the controller 105 does not need to re-determine the preset pressure difference, so that even if a quantity of the boards mounted on the branch water pipe 101 changes, the controller 105 may correspondingly adjust, according to the unchanged preset pressure difference, a flow capacity of coolant flowing into the branch water pipe 101. Therefore, even if the quantity of boards mounted on the branch water pipe 101 changes, the flow capacity of the coolant flowing into the branch water pipe 101 is even and constant, which effectively avoids a temperature change of the coolant flowing through the branch water pipe 101, thereby improving heat dissipation reliability and stability of the heat dissipation apparatus and usability and service life of the heat dissipation apparatus.

The following describes how the controller 105 adjusts the flow capacity of the coolant flowing into the branch water pipe 101 in this embodiment.

That is, in this embodiment, the controller 105 correspondingly adjusts the water pump 103 according to the current pressure difference and the preset pressure difference, to control the flow capacity of the coolant flowing into the branch water pipe 101, until an absolute value of a difference between the current pressure difference and the preset pressure difference is less than or equal to a preset error amount.

The controller 105 ensures that the absolute value of the difference between the current pressure difference and the preset pressure difference is less than or equal to the preset error amount using the water pump 103, so that the current pressure difference obtained after the adjustment can meet heat dissipation demands of all boards mounted on the branch water pipe 101. Therefore, components on all the boards mounted on the branch water pipe 101 runs without derating. In addition, the controller 105 can correspondingly adjust a rotation speed of the water pump 103 after detecting that the current pressure difference changes, so as to adjust the flow capacity of the coolant flowing into the branch water pipe 101 by adjusting the rotation speed of the water pump 103, thereby ensuring that the flow capacity of the coolant flowing into the branch water pipe 101 is even and constant, further ensuring reliability of the heat dissipation apparatus in a heat dissipation process, and reducing energy consumption for heat dissipation.

It should be clarified that a manner of correspondingly adjusting, by the controller 105 according to the current pressure difference between the inflow pressure and the outflow pressure, the flow capacity of the coolant flowing into the branch water pipe 101 is not limited only to adjusting the rotation speed of the water pump 103, and a blower impeller of the water pump 103 may also be set as changeable. That is, a rotation amplitude or a length of the blower impeller is correspondingly adjusted according to a change of the difference, and the flow capacity of the coolant flowing into the branch water pipe 101 is adjusted by means of the changeable rotation amplitude or length of the blower impeller. No limitation is imposed on a specific adjustment manner in this embodiment, provided that the controller 105 can correspondingly adjust, according to a change of the current pressure difference, the flow capacity of the coolant flowing into the branch water pipe 101.

According to this embodiment, a controller 105 can correspondingly adjust, according to the current pressure difference, a flow capacity of coolant flowing into a branch water pipe 101, so that an absolute value of a difference between the current pressure difference and the preset pressure difference is less than or equal to a preset error amount. Therefore, the heat dissipation apparatus according to this embodiment ensures that heat dissipation demands mounted on the branch water pipe 101 are met, and avoids running, with derating, of a component on a board. In addition, even if a quantity of boards mounted on the branch water pipe 101 changes, the controller 105 can also control, to be even and constant, the flow capacity of the coolant flowing into the branch water pipe 101, which effectively avoids a temperature change of the coolant flowing through the branch water pipe 101, thereby improving heat dissipation reliability and stability of the heat dissipation apparatus and usability and service life of the heat dissipation apparatus.

Detailed descriptions on the structure of the heat dissipation apparatus are provided in the embodiment shown in FIG. 1. The following describes, with reference to an embodiment shown in FIG. 2, a specific structure of a heat dissipation apparatus that can calculate a current pressure difference between inflow pressure and outflow pressure using a controller.

Figure 2:
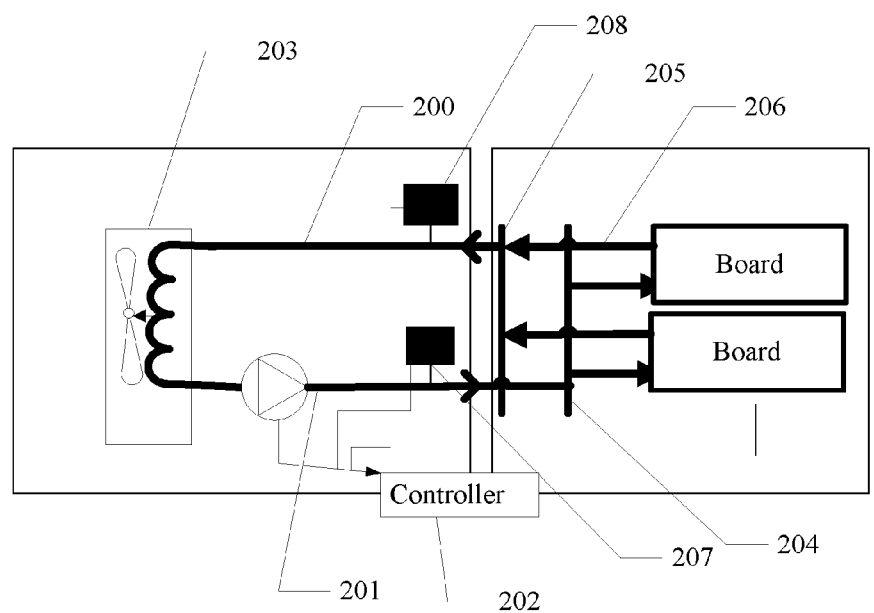
FIG. 2 is a schematic structural diagram of another embodiment of a heat dissipation apparatus according to an embodiment of the present disclosure.

First, detailed descriptions on specific structures of a main water pipe and a branch water pipe of the heat dissipation apparatus are provided with reference to the embodiment shown in FIG. 2.

As shown in FIG. 2, the main water pipe includes an inflow pipe 201 and a backflow pipe 200. The inflow pipe 201 is used to ensure that coolant that has been cooled by a heat exchanger 203 flows into the branch water pipe.

The backflow pipe 200 is used to ensure that coolant that has absorbed heat of a board flows back into the backflow pipe 200, so that coolant in the backflow pipe 200 is cooled by the heat exchanger 203.

Further, the branch water pipe includes a flow dividing pipe 204, a flow collecting pipe 205, and multiple parallelly disposed branch pipes 206.

Still further, the flow dividing pipe 204 is connected to both the inflow pipe 201 and the branch pipe 206, so that coolant in the inflow pipe 201 flows into the branch pipes 206 evenly through the flow dividing pipe 204.

In addition, the flow collecting pipe 205 is connected to both the backflow pipe 200 and the branch pipes 206, so that coolant in the branch pipes 206 flows into the backflow pipe 200 evenly through the flow collecting pipe 205.

The coolant that is cooled using the heat exchanger 203 flows into the flow dividing pipe 204 of the branch water pipe through the inflow pipe 201.

The coolant in the flow dividing pipe 204 flows into the multiple parallelly disposed branch pipes 206 evenly.

The coolant that flows in the branch pipes 206 cools boards mounted on the branch pipes 206, and the coolant that has absorbed heat of the boards flows back into the flow collecting pipe 205.

Coolant in the flow collecting pipe 205 flows into the backflow pipe 200 circularly and evenly, and coolant that has absorbed the heat of the boards and that is in the backflow pipe 200 is cooled using the heat exchanger 203 connected to the backflow pipe 200.

Still referring to FIG. 2, it can be known that a first pressure sensor 207 is disposed on the inflow pipe 201, and a second pressure sensor 208 is disposed on the backflow pipe 200.

The first pressure sensor 207 located on the inflow pipe 201 can obtain inflow pressure of the coolant flowing into the flow dividing pipe 204.

The second pressure sensor 208 located on the backflow pipe 200 can obtain outflow pressure of coolant flowing out of the flow collecting pipe 205.

It should be clarified that in this embodiment, that the first pressure sensor 207 is disposed on the inflow pipe 201 is used as an example for description, and no limitation is imposed on a specific location for disposing the first pressure sensor 207, provided that the first pressure sensor 207 can obtain the inflow pressure of the coolant flowing into the flow dividing pipe 204. For example, the first pressure sensor 207 may also be disposed on the flow dividing pipe 204.

In this embodiment, that the second pressure sensor 208 is disposed on the backflow pipe 200 is used as an example for description, and no limitation is imposed on a specific location for disposing the second pressure sensor 208, provided that the second pressure sensor 208 can obtain the outflow pressure of the coolant flowing out of the flow collecting pipe 205. For example, the second pressure sensor 208 may also be disposed on the flow collecting pipe 204.

The controller 202 is connected to both the first pressure sensor 207 and the second pressure sensor 208, and the controller 202 is configured to calculate the current pressure difference according to the inflow pressure of the coolant flowing into the flow dividing pipe 204 and the outflow pressure of the coolant flowing out of the flow collecting pipe 205.

Further, the controller 202 correspondingly adjusts, according to the current pressure difference obtained through calculation by the controller 202, a flow capacity of the coolant flowing into the flow dividing pipe 204, until an absolute value of a difference between the current pressure difference and the preset pressure difference is less than or equal to a preset error amount.

For determining of the preset pressure difference and a specific manner of adjusting the flow correspondingly according to the preset pressure difference, refer to the embodiment shown in FIG. 1, and details are not described in this embodiment.

In this embodiment, a value range of the preset error amount is greater than or equal to 0, and is less than or equal to 10% of the preset pressure difference.

It should be clarified that in this embodiment, the value range of the preset error amount is used as an example for description, and no limitation is imposed on a specific value range of the preset error amount in this embodiment.

In this embodiment, a main water pipe includes an inflow pipe 201 and a backflow pipe 200, and the branch water pipe includes a flow dividing pipe 204, a flow collecting pipe 205, and multiple parallelly disposed branch pipes 206. A first pressure sensor 207 is disposed on the inflow pipe 201, and a second pressure sensor 208 is disposed on the backflow pipe 200. The controller 202 calculates a difference between inflow pressure of coolant flowing into the flow dividing pipe 204 and outflow pressure of coolant flowing out of the flow collecting pipe 205, and correspondingly adjusts, according to the difference obtained through calculation by the controller 202, a flow capacity of the coolant flowing into the flow dividing pipe 204. According to this embodiment, the controller can calculate the current pressure difference according to the inflow pressure and the outflow pressure that are obtained by the controller, and correspondingly adjust the flow capacity of the coolant according to the current pressure difference obtained through calculation by the controller. Therefore, even if a quantity of boards changes, temperature of a heat dissipation apparatus is kept constant by adjusting the flow capacity of the coolant, thereby improving reliability and stability of the heat dissipation apparatus.

The specific structure of the heat dissipation apparatus that can calculate the current pressure difference between the inflow pressure and the outflow pressure using the controller is described in the embodiment shown in FIG. 2. The following describes, with reference to an embodiment shown in FIG. 3, a specific structure of a heat dissipation apparatus that can obtain a current pressure difference between inflow pressure and outflow pressure using a differential pressure sensor.

Figure 3:
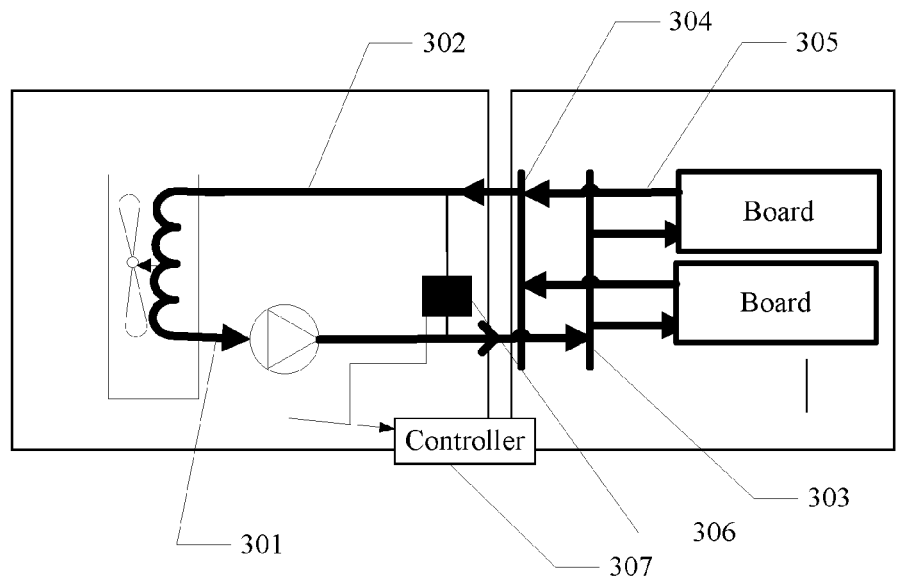
FIG. 3 is a schematic structural diagram of another embodiment of a heat dissipation apparatus according to an embodiment of the present disclosure.

For specific structures of an inflow pipe 301 and a backflow pipe 302 that are included by a main water pipe of the heat dissipation apparatus in FIG. 3, and a flow dividing pipe 303, a flow collecting pipe 304, and multiple parallelly disposed branch pipes 305 that are included by a branch water pipe of the heat dissipation apparatus in FIG. 3, refer to the embodiment shown in FIG. 2, and details are not described in this embodiment.

As shown in FIG. 3, it can be known that a differential pressure sensor 306 of the heat dissipation apparatus includes a first pressure interface, a second pressure interface, and a calculation module.

The first pressure interface of the differential pressure sensor 306 is disposed on the inflow pipe 301, and is configured to obtain inflow pressure of coolant flowing into the flow dividing pipe 303.

It should be clarified that, that the first pressure interface of the differential pressure sensor 306 is disposed on the inflow pipe 301 is used as an example for description, and no limitation is imposed on a specific location for disposing the first pressure interface of the differential pressure sensor 306 in this embodiment, provided that the first pressure interface of the differential pressure sensor 306 can obtain the inflow pressure of the coolant flowing into the flow dividing pipe 303. For example, the first pressure interface of the differential pressure sensor 306 is disposed on the flow dividing pipe 303.

The second pressure interface of the differential pressure sensor 306 is disposed on the backflow pipe 302, and is configured to obtain outflow pressure of coolant flowing out of the flow collecting pipe 302.

It should be clarified that, that the second pressure interface of the differential pressure sensor 306 is disposed on the backflow pipe 302 is used as an example for description, and no limitation is imposed on a specific location for disposing the second pressure interface of the differential pressure sensor 306 in this embodiment, provided that the second pressure interface of the differential pressure sensor 306 can obtain the outflow pressure of the coolant flowing out of the flow collecting pipe 302. For example, the first pressure interface of the differential pressure sensor 306 is disposed on the flow collecting pipe 304.

The differential pressure sensor 306 further includes the calculation module connected to both the first pressure interface and the second pressure interface, where the calculation module is configured to calculate a difference between the inflow pressure and the outflow pressure.

A controller 307 of the heat dissipation apparatus is connected to the differential pressure sensor 306, the controller 307 can obtain the difference obtained through calculation by the differential pressure sensor 306, and the controller 307 determines, as the current pressure difference, the difference that is obtained through calculation by the differential pressure sensor 306 and that has been obtained by the controller 307.

The controller 307 correspondingly adjusts, according to the current pressure difference, a flow capacity of the coolant flowing into the flow dividing pipe 303. In this case, if a quantity of boards mounted on the branch pipe 305 changes, the controller can correspondingly adjust the flow capacity of the coolant according to the pressure difference calculated by the differential pressure sensor 306, to ensure that temperature of the heat dissipation apparatus is constant.

In this embodiment, a first pressure interface of a differential pressure sensor 306 of a heat dissipation apparatus is disposed on the inflow pipe 301, a second pressure interface of the differential pressure sensor 306 is disposed on the backflow pipe 302, and a calculation module of the differential pressure sensor 306 is configured to calculate a difference between the inflow pressure and the outflow pressure. A controller 307 can obtain the difference obtained through calculation by the differential pressure sensor 306, and the controller 307 correspondingly adjusts, according to the difference, a flow capacity of coolant flowing into a flow dividing pipe 303. According to this embodiment, the controller 307 obtains the difference obtained through calculation by the differential pressure sensor 306 and correspondingly adjusts the flow capacity of the coolant, so that when a quantity of boards mounted on branch boards 305, the controller 307 can correspondingly adjust the flow capacity of the coolant according to a change of the difference, thereby effectively ensuring temperature constancy of the heat dissipation apparatus and improving heat dissipation performance and reliability of the heat dissipation apparatus.

The specific structure of the heat dissipation apparatus that can calculate the difference between the inflow pressure and the outflow pressure using the controller is described in the embodiment shown in FIG. 2. The specific structure of the heat dissipation apparatus that can obtain the current pressure difference between the inflow pressure and the outflow pressure using the differential pressure sensor is described in the embodiment shown in FIG. 3. The following describes, with reference to an embodiment shown in FIG. 4, a specific structure of a heat dissipation apparatus that estimates a quantity of boards additionally mountable on branch pipes.

Figure 4:
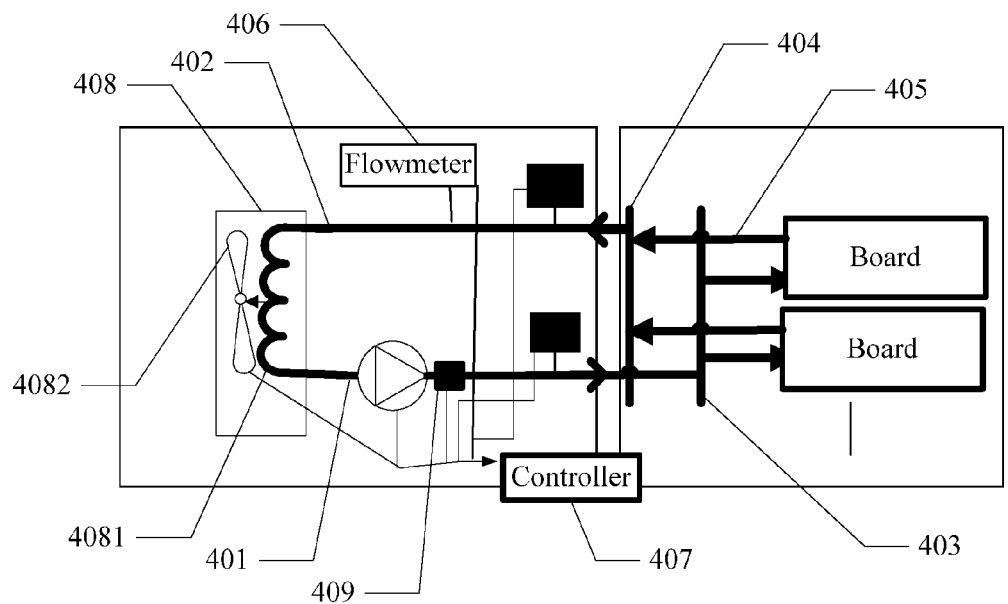
FIG. 4 is a schematic structural diagram of another embodiment of a heat dissipation apparatus according to an embodiment of the present disclosure.

For specific structures of an inflow pipe 401 and a backflow pipe 402 that are included by a main water pipe of the heat dissipation apparatus in FIG. 4, and a flow dividing pipe 403, a flow collecting pipe 404, and multiple parallelly disposed branch pipes 405 that are included by a branch water pipe of the heat dissipation apparatus in FIG. 4, refer to the embodiment shown in FIG. 2, and details are not described in this embodiment.

A flowmeter 406 is disposed on the inflow pipe 401 or the backflow pipe 402. In this embodiment, as shown in FIG. 4, that the flowmeter 406 is disposed on the backflow pipe 402 is used as an example for description, but the flowmeter 406 is not limited to being disposed on the backflow pipe 402.

The controller 407 is connected to the flowmeter 406, so that the controller 407 obtains a current flow capacity, monitored by the flowmeter 406, of coolant in the main water pipe.

The controller 407 is connected to a sensor located on the main water pipe. The sensor may be the pressure sensor shown in FIG. 2, and for a specific structure of the sensor, refer to FIG. 2. The sensor may also be the differential pressure sensor shown in FIG. 3, and for a specific structure of the sensor, refer to FIG. 3. Details are not described in this embodiment.

The controller 407 pre-determines a fully loaded flow capacity.

The fully loaded flow capacity is a flow capacity, of the coolant in the main water pipe, existing when an absolute value of a difference between the current pressure difference and the preset pressure difference is less than or equal to the preset error amount and a board that meets a preset condition is mounted on each of the branch pipes 405.

The preset condition is that the initial pressure difference that has been set for the board mounted on the branch pipe 405 is less than or equal to the preset pressure difference.

That is, this embodiment is applied to a scenario in which an initial pressure difference of each newly added board is less than or equal to the preset pressure difference. If an initial pressure difference of a newly added board is greater than the preset pressure difference, it can be known from the embodiment shown in FIG. 1 that the controller 407 needs to reset the preset pressure difference according to the initial pressure difference of the newly added board, so as to meet a heat dissipation demand of each board.

It should be clarified that if the initial pressure difference of the newly added board is greater than the preset pressure difference and after the controller 407 resets the preset pressure difference, a quantity of boards additionally mountable on the branch pipe may be further estimated in a manner shown in this embodiment.

After the controller 407 determines the fully loaded flow capacity, the controller 407 is further configured to obtain the current flow capacity and determine that a quotient of the fully loaded flow capacity and a total quantity of the branch pipes 405 is a branch flow capacity.

The controller 407 determines a quotient of a difference between the fully loaded flow capacity and the current flow capacity and the branch flow capacity. The controller 407 further determines whether the quotient of the difference between the fully loaded flow capacity and the current flow capacity and the branch flow capacity is an integer.

If yes, the controller 407 determines that the quotient is a quantity of boards that are additionally mountable on the branch pipes and that meet the preset condition.

If no, the controller 407 determines that an integer part of the quotient is a quantity of boards that are additionally mountable on the branch pipes 405 and that meet the preset condition.

Still further, a temperature sensor 409 is disposed on the inflow pipe 401, and the temperature sensor 409 is connected to the controller 407. The temperature sensor 409 is configured to obtain temperature of coolant in the inflow pipe 401, so that the controller 407 correspondingly adjusts the flow capacity according to the temperature, to keep, within a preset range, the temperature of the coolant in the inflow pipe 401.

The preset range is not limited in this embodiment provided that no condensation exists on the main water pipe and the branch water pipe of the heat dissipation apparatus whose temperature is kept within the preset range.

In the embodiment shown in FIG. 4, a heat exchanger configured to cool the coolant in the main water pipe is an air-to-liquid heat exchanger 408.

It should be clarified that the heat exchanger configured to cool the coolant in the main water pipe may also be a liquid-to-liquid heat exchanger. For a specific structure of the heat exchanger, refer to an embodiment shown in FIG. 5.

The air-to-liquid heat exchanger 408 includes a first heat exchange pipe assembly 4081 connected to both the inflow pipe 401 and the backflow pipe 402

A motor whose rotation speed is adjustable and the first heat exchange pipe assembly 4081 are parallelly disposed.

The motor drives at least one blower impeller 4082 to generate cold wind used to cool coolant in the first heat exchange pipe assembly 4081.

The controller 407 is connected to the motor. The controller 407 is configured to correspondingly adjust the rotation speed of the motor according to the temperature, obtained by the temperature sensor 409, of the coolant in the inflow pipe, so as to ensure temperature constancy of the coolant in the inflow pipe.

In this embodiment, the controller 407 is connected to a flowmeter 406 located on a main water pipe, so that the controller 407 obtains a current flow capacity of coolant monitored by the flowmeter 406 and determines, according to the current flow capacity, a quantity of boards additionally mountable on branch pipes 405. According to this embodiment, the controller can estimate the quantity of boards additionally mountable on the branch pipes 405, facilitating management on the quantity of boards. The controller 407 can accurately control a flow capacity of coolant flowing through each board, so as to ensure reliable heat dissipation of a heat dissipation apparatus, enhance stability in a heat dissipation process, and improve performance of the heat dissipation apparatus.

A specific structure of the heat dissipation apparatus that estimates the quantity of boards additionally mountable on the branch pipes is described in the embodiment shown in FIG. 4. The following describes, with reference to an embodiment shown in FIG. 5, a specific structure of a heat dissipation apparatus that estimates, using a throttling apparatus, a quantity of boards additionally mountable on branch pipes.

Figure 5:
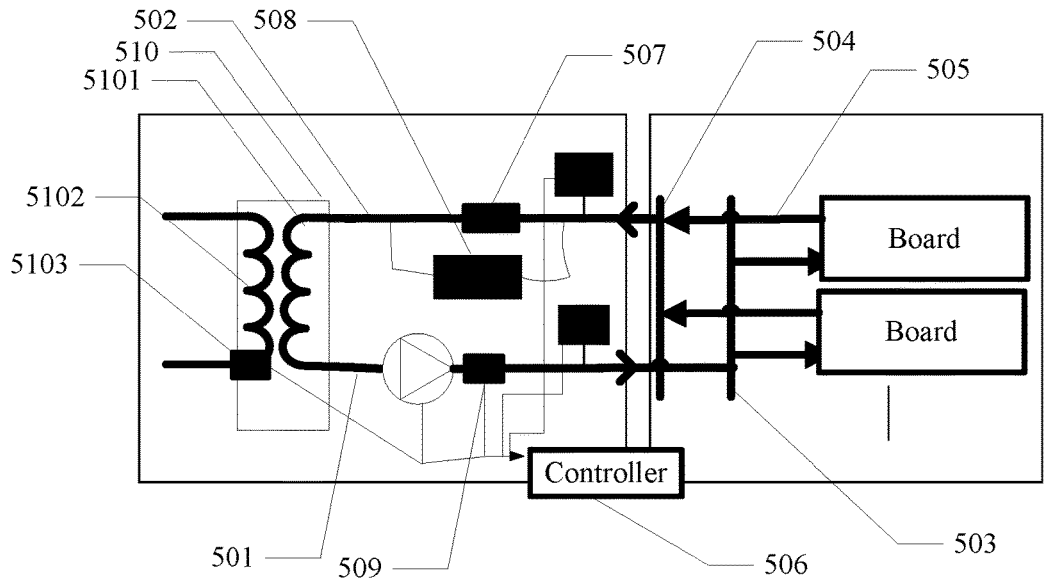
FIG. 5 is a schematic structural diagram of another embodiment of a heat dissipation apparatus according to an embodiment of the present disclosure.

For specific structures of an inflow pipe 501 and a backflow pipe 502 that are included by a main water pipe of the heat dissipation apparatus in FIG. 5, and a flow dividing pipe 503, a flow collecting pipe 504, and multiple parallelly disposed branch pipes 505 that are included by a branch water pipe of the heat dissipation apparatus in FIG. 5, refer to the embodiment shown in FIG. 4, and details are not described in this embodiment.

To ensure that a controller 506 determines a quantity of boards additionally mountable on the branch pipes 505, the controller needs to obtain a flow capacity of coolant in the main water pipe.

In this embodiment, the controller 506 obtains the flow capacity of the coolant in the main water pipe using a throttling apparatus 507 located on the main water pipe.

The controller 506 is connected to a sensor located on the main water pipe. The sensor may be the pressure sensor shown in FIG. 2, and for a specific structure of the sensor, refer to FIG. 2. The sensor may also be the differential pressure sensor shown in FIG. 3, and for a specific structure of the sensor, refer to FIG. 3. Details are not described in this embodiment.

To ensure that the controller 506 obtains the flow capacity of the coolant in the main water pipe, the controller 506 may preset a correspondence between a pressure difference between two ends of the throttling apparatus and the flow capacity of the coolant in the main water pipe, so that the controller 506 determines the flow capacity, corresponding to the pressure difference between the two ends of the throttling apparatus 507, of the coolant in the main water pipe according to the correspondence.

The controller 506 can determine, by determining the flow capacity of the coolant in the main water pipe, the quantity of boards additionally mountable on the branch pipes 505. For a specific determining manner, refer to the embodiment shown in FIG. 4, and details are not described in this embodiment.

A specific manner of obtaining the pressure difference between the two ends of the throttling apparatus 507 by the controller 506 is as follows. The throttling apparatus 507 is disposed on the backflow pipe 502; a second differential pressure sensor 508 is connected to the throttling apparatus; the second differential pressure sensor 508 includes a third pressure interface, a fourth pressure interface, and a second calculation module; a first end of the throttling apparatus 507 is connected to the third pressure interface, and the third pressure interface is configured to obtain pressure at the first end of the throttling apparatus; a second end of the throttling apparatus 507 is connected to the fourth pressure interface, and the fourth pressure interface is configured to obtain pressure at the second end of the throttling apparatus; the second calculation module is connected to both the third pressure interface and the fourth pressure interface, and the second calculation module is configured to calculate a third pressure difference between the two ends of the throttling apparatus 507 according to the pressure at the first end of the throttling apparatus 507 and the pressure at the second end of the throttling apparatus 507; and the controller 506 is connected to the second differential pressure sensor 508, and the controller 506 is configured to obtain the third pressure difference.

The controller 506 determines a current flow capacity, corresponding to the third pressure difference, of the coolant in the main water pipe according to the correspondence preset by the controller 506, and determines, according to the current flow capacity of the coolant in the main water pipe, the quantity of boards additionally mountable on the branch water pipe. For details about how the controller determines, according to the current flow capacity, the quantity of additionally mountable boards, refer to the embodiment shown in FIG. 4, and details are not described in this embodiment.

Preferably, a manner of disposing the throttling apparatus 507 is not only limited to that shown in FIG. 5. The throttling apparatus 507 may also be disposed on the inflow pipe 501, and a second differential pressure sensor is connected to the throttling apparatus located on the inflow pipe 501.

More preferably, to ensure that the controller 506 obtains the pressure difference between the two ends of the throttling apparatus 507, pressure sensors may be further disposed at the two ends of the throttling apparatus 507 respectively, which is as follows. The throttling apparatus 507 is disposed on the inflow pipe 501; the first end of the throttling apparatus 507 is connected to the first pressure sensor; the second end of the throttling apparatus 507 is connected to a third pressure sensor, and the third pressure sensor is disposed on the inflow pipe; and the controller 506 is connected to both the first pressure sensor and the third pressure sensor, and the controller 506 is configured to calculate a first pressure difference between the two ends of the throttling apparatus according to pressure obtained by the first pressure sensor and pressure obtained by the third pressure sensor.

The controller 506 determines a current flow capacity, corresponding to the first pressure difference between the two ends of the throttling apparatus, of the coolant in the main water pipe according to the correspondence preset by the controller 506, so that the controller determines, according to the current flow capacity of the coolant in the main water pipe, the quantity of boards additionally mountable on the branch water pipe.

Alternatively, the throttling apparatus 507 is disposed on the backflow pipe 502; the first end of the throttling apparatus 507 is connected to the second pressure sensor; the second end of the throttling apparatus 507 is connected to a fourth pressure sensor, and the fourth pressure sensor is disposed on the backflow pipe; and the controller 506 is connected to both the second pressure sensor and the fourth pressure sensor, and the controller 506 is configured to calculate a second pressure difference between the two ends of the throttling apparatus according to pressure obtained by the second pressure sensor and pressure obtained by the fourth pressure sensor, and obtains a current flow capacity of the coolant in the main water pipe according to the second pressure difference between the two ends of the throttling apparatus, so that the controller determines, according to the current flow capacity of the coolant in the main water pipe, the quantity of boards additionally mountable on the branch water pipe.

Further, a temperature sensor 509 is disposed on the inflow pipe 501, and the temperature sensor 509 is connected to the controller 506. The temperature sensor 509 is configured to obtain temperature of coolant in the inflow pipe 501, so that the controller 506 correspondingly adjusts the flow capacity according to the temperature, to keep, within a preset range, the temperature of the coolant in the inflow pipe 501.

The preset range is not limited in this embodiment provided that no condensation exists on the main water pipe and the branch water pipe of the heat dissipation apparatus whose temperature is kept within the preset range.

In the embodiment shown in FIG. 5, a heat exchanger configured to cool the coolant in the main water pipe is a liquid-to-liquid heat exchanger 510.

It should be clarified that the heat exchanger configured to cool the coolant in the main water pipe may also be an air-to-liquid heat exchanger. For a specific structure of the heat exchanger, refer to the embodiment shown in FIG. 4.

The liquid-to-liquid heat exchanger 510 includes a first heat exchange pipe assembly 5101 connected to both the inflow pipe 501 and the backflow pipe 502.

A second heat exchange pipe assembly 5102 and the first heat exchange pipe assembly 5101 are parallelly disposed.

A regulating valve 5103 is connected to the second heat exchange pipe assembly 5102.

The controller 506 is connected to the regulating valve 5103, the controller 506 is configured to correspondingly adjust an opening degree of the regulating valve 5103 according to the temperature, obtained by the temperature sensor 509, of the coolant in the inflow pipe 501, so as to control a flow capacity of coolant in the second heat exchange pipe assembly 5102, thereby ensuring that the temperature of the coolant in the inflow pipe 501 is kept within the preset range.

In this embodiment, a controller 506 may preset a correspondence between a pressure difference between two ends of a throttling apparatus and a flow capacity of coolant in a main water pipe; the throttling apparatus 507 is disposed on a backflow pipe 502; a second differential pressure sensor 508 is connected to the throttling apparatus; the second differential pressure sensor 508 may determine a pressure difference between the two ends of the throttling apparatus 507; the controller 506 determines a current flow capacity, corresponding to the third pressure difference, of the coolant in the main water pipe according to the correspondence preset by the controller 506, and determines, according to the current flow capacity of the coolant in the main water pipe, a quantity of boards additionally mountable on the branch water pipe. In this embodiment, the controller 506 can estimate the quantity of boards additionally mountable on branch pipes, facilitating management on the quantity of boards. The controller 506 can accurately control a flow capacity of coolant flowing through each board, so as to ensure reliable heat dissipation of a heat dissipation apparatus, enhance stability in a heat dissipation process, and improve performance of the heat dissipation apparatus.

To ensure that the heat dissipation apparatus according to this embodiment can implement on-line water treatment, a water treatment interface is reserved on the inflow pipe 501 or the backflow pipe 502.

The water treatment interface is used to connect a water treatment system.

The water treatment system is used to purify and detect coolant that flows circularly in the main water pipe and the branch water pipe.

If the heat dissipation apparatus is connected to the water treatment system using the water treatment interface, a current pressure difference between inflow pressure and outflow pressure changes. In this case, the controller 506 controls a rotation speed of a water pump to ensure that the current pressure difference between the inflow pressure and the outflow pressure is equal to or approximate to a preset pressure difference, so that reliable running of the heat dissipation apparatus connected to the water treatment system can be ensured. In addition, that flow capacities of coolant flowing into the branch pipes 505 are a branch flow capacity can be ensured, so as to ensure an effect of cooling a board.

In addition, after the water treatment system is removed, the controller 506 may also ensure, by controlling the rotation speed of the water pump, that the current pressure difference between the inflow pressure and the outflow pressure is equal to or approximate to the preset pressure difference.

Detailed descriptions on the specific structure of the heat dissipation apparatus are provided in the embodiments shown in FIG. 1 to FIG. 5. The following describes, with reference to an embodiment shown in FIG. 6, in detail a heat dissipation control method based on the heat dissipation apparatus.

601: A controller determines a current pressure difference between inflow pressure and outflow pressure.

The inflow pressure is pressure of coolant flowing into a branch water pipe, the outflow pressure is pressure of coolant flowing out of the branch water pipe, the inflow pressure and the outflow pressure are obtained by a sensor, and the branch water pipe is configured to cool a board mounted on the branch water pipe.

For details about how the controller determines the current pressure difference between the inflow pressure and the outflow pressure, refer to the embodiments shown in FIG. 1 to FIG. 5, and details are not described in this embodiment.

602: The controller determines a maximum value of initial pressure differences of every two boards as a preset pressure difference.

The initial pressure difference is a pressure difference required for ensuring that each component on the board runs without derating.

For details about how the controller determines the preset pressure difference, refer to the embodiments shown in FIG. 1 to FIG. 5, and details are not described in this embodiment.

603: The controller correspondingly adjusts a water pump according to the current pressure difference and the preset pressure difference, to control a flow capacity of coolant flowing into the branch water pipe, until an absolute value of a difference between the current pressure difference and the preset pressure difference is less than or equal to a preset error amount.

The water pump is disposed on a main water pipe connected to the branch water pipe.

The controller generates, according to the current pressure difference and the preset pressure difference, rotation speed stepping used to adjust a rotation speed of the water pump.

The rotation speed stepping is an electric pulse signal used to control the rotation speed of the water pump. The water pump adjusts its own rotation speed gradually according to the rotation speed stepping, to adjust the current pressure difference between the inflow pressure and the outflow pressure, until the absolute value of the difference between the current pressure difference and the preset pressure difference is less than or equal to the preset error amount, thereby ensuring even flow capacities of coolant in branch pipes.

The controller may generate the rotation speed stepping by means of pulse width modulation (PWM) or by adjusting a frequency of a frequency converter of the water pump.

For details about how the controller controls the flow capacity of the coolant flowing into the branch water pipe, refer to the embodiments shown in FIG. 1 to FIG. 5, and details are not described in this embodiment.

According to this embodiment, a controller can correspondingly adjust, according to the current pressure difference, a flow capacity of coolant flowing into a branch water pipe, so that an absolute value of a difference between the current pressure difference and the preset pressure difference is less than or equal to a preset error amount. Therefore, the heat dissipation apparatus according to this embodiment ensures that heat dissipation demands of all boards mounted on the branch water pipe are met, and avoids running, with derating, of a component on a board. In addition, even if a quantity of boards mounted on the branch water pipe changes, the controller can also control, to be even and constant, the flow capacity of the coolant flowing into the branch water pipe, which effectively avoids a temperature change of the coolant flowing through the branch water pipe, thereby improving heat dissipation reliability and stability of the heat dissipation apparatus and usability and service life of the heat dissipation apparatus.

Figure 6:
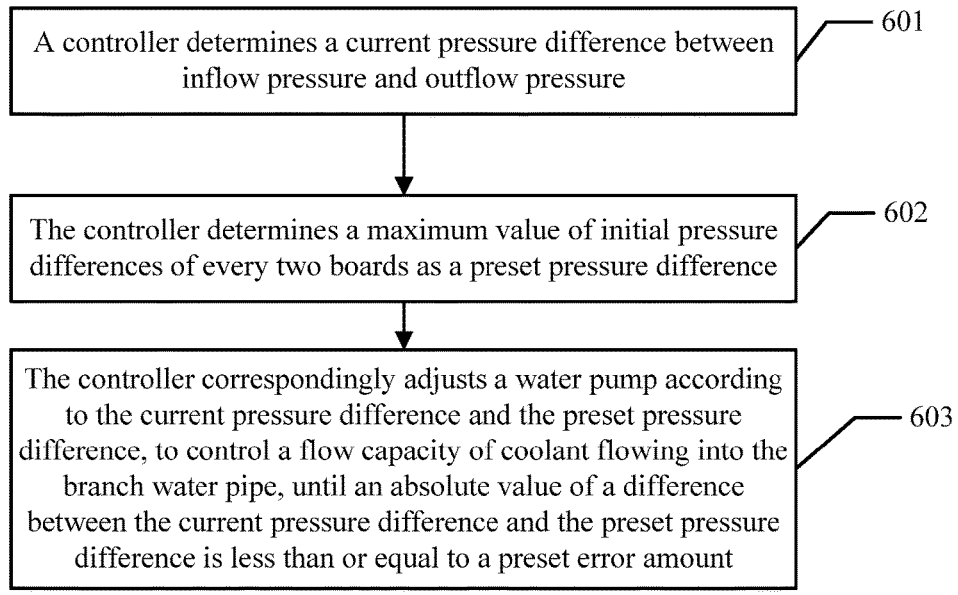
FIG. 6 is a flowchart of steps in an embodiment of a heat dissipation method according to an embodiment of the present disclosure.

Detailed descriptions on the heat dissipation control method based on the heat dissipation apparatus are provided in the embodiment shown in FIG. 6. The following describes, with reference to an embodiment shown in FIG. 7, how a heat dissipation apparatus determines a current pressure difference using a pressure sensor.

701: The controller obtains the inflow pressure that has been obtained by a first pressure sensor.

The first pressure sensor is configured to obtain the inflow pressure.

For details about how the controller obtains the inflow pressure that has been obtained by the first pressure sensor, refer to the embodiment shown in FIG. 2, and details are not described in this embodiment.

702: The controller obtains the outflow pressure that has been obtained by a second pressure sensor.

The second pressure sensor is configured to obtain the outflow pressure.

For details about how the controller obtains the outflow pressure that has been obtained by the second pressure sensor, refer to the embodiment shown in FIG. 2, and details are not described in this embodiment.

703: The controller calculates the current pressure difference according to the inflow pressure that has been obtained by the first pressure sensor and the outflow pressure that has been obtained by the second pressure sensor.

For details about how the controller calculates the current pressure difference, refer to the embodiment shown in FIG. 2, and details are not repeatedly described in this embodiment.

The main water pipe includes an inflow pipe and a backflow pipe.

The branch water pipe includes a flow dividing pipe, a flow collecting pipe, and multiple parallelly disposed branch pipes.

The flow dividing pipe is connected to both the inflow pipe and the branch pipes, so that coolant in the inflow pipe flows into the branch pipes evenly through the flow dividing pipe.

The flow collecting pipe is connected to both the backflow pipe and the branch pipes, so that coolant in the branch pipes flows into the backflow pipe evenly through the flow collecting pipe.

The sensor includes the first pressure sensor and the second pressure sensor.

The first pressure sensor is disposed on the inflow pipe or the flow dividing pipe, and is configured to obtain inflow pressure of coolant flowing into the flow dividing pipe.

The second pressure sensor is disposed on the backflow pipe or the flow collecting pipe, and is configured to obtain outflow pressure of coolant flowing out of the flow collecting pipe.

For specific structures of the main water pipe and the branch water pipe, refer to the embodiment shown in FIG. 2; and for specific manners of disposing the first pressure sensor and the second pressure sensor, refer to the embodiment shown in FIG. 2.

704: The controller determines a maximum value of initial pressure differences of every two boards as a preset pressure difference.

705: The controller correspondingly adjusts a water pump according to the current pressure difference and the preset pressure difference, to control a flow capacity of coolant flowing into the branch water pipe, until an absolute value of a difference between the current pressure difference and the preset pressure difference is less than or equal to a preset error amount.

In this embodiment, processes of step 704 and step 705 are the same as those of step 602 and step 603 that are shown in FIG. 6, and details are not described in this embodiment.

According to this embodiment, a controller can calculate the current pressure difference according to inflow pressure and outflow pressure that are obtained by the controller, and correspondingly adjust a flow capacity of coolant according to the current pressure difference obtained through calculation by the controller. Therefore, even if a quantity of boards changes, temperature of a heat dissipation apparatus is kept constant by adjusting the flow capacity of the coolant, thereby improving reliability and stability of the heat dissipation apparatus.

Detailed descriptions on the heat dissipation control method based on the heat dissipation apparatus are provided in the embodiment shown in FIG. 6. The following describes, with reference to an embodiment shown in FIG. 8, how a heat dissipation apparatus determines a current pressure difference using a differential pressure sensor.

For specific structures of a main water pipe and a branch water pipe that are shown in this embodiment, refer to the embodiment shown in FIG. 2, and details are not described in this embodiment.

A differential pressure sensor shown in this embodiment includes a first pressure interface, a second pressure interface, and a calculation module, where the first pressure interface is disposed on the inflow pipe, and is configured to obtain inflow pressure of coolant flowing into the flow dividing pipe; the second pressure interface is disposed on the backflow pipe, and is configured to obtain outflow pressure of coolant flowing out of the flow collecting pipe; and the first calculation module is connected to both the first pressure interface and the second pressure interface, and the first calculation module is configured to calculate a difference between the inflow pressure and the outflow pressure. For a specific structure of the differential pressure sensor, refer to the embodiment shown in FIG. 3.

801: The controller obtains the difference between the inflow pressure and the outflow pressure that has been calculated by the calculation module.

802: The controller determines that the difference is the current pressure difference.

803: The controller determines a maximum value of initial pressure differences of every two boards as a preset pressure difference.

804: The controller correspondingly adjusts a water pump according to the current pressure difference and the preset pressure difference, to control a flow capacity of coolant flowing into the branch water pipe, until an absolute value of a difference between the current pressure difference and the preset pressure difference is less than or equal to a preset error amount.

Processes of step 803 and step 804 that are shown in this embodiment are the same as those of step 602 and step 603 that are shown in FIG. 6, and details are not described in this embodiment.

According to this embodiment, a controller correspondingly adjusts a flow capacity of coolant according to the current pressure difference. In this embodiment, the controller obtains a difference obtained through calculation by a differential pressure sensor and correspondingly adjusts the flow capacity of the coolant. Therefore, when a quantity of boards mounted on branch boards changes, the controller can correspondingly adjust the flow capacity of the coolant according to a change of the difference, thereby effectively ensuring temperature constancy of a heat dissipation apparatus and improving heat dissipation performance and reliability of the heat dissipation apparatus.

Figure 9:
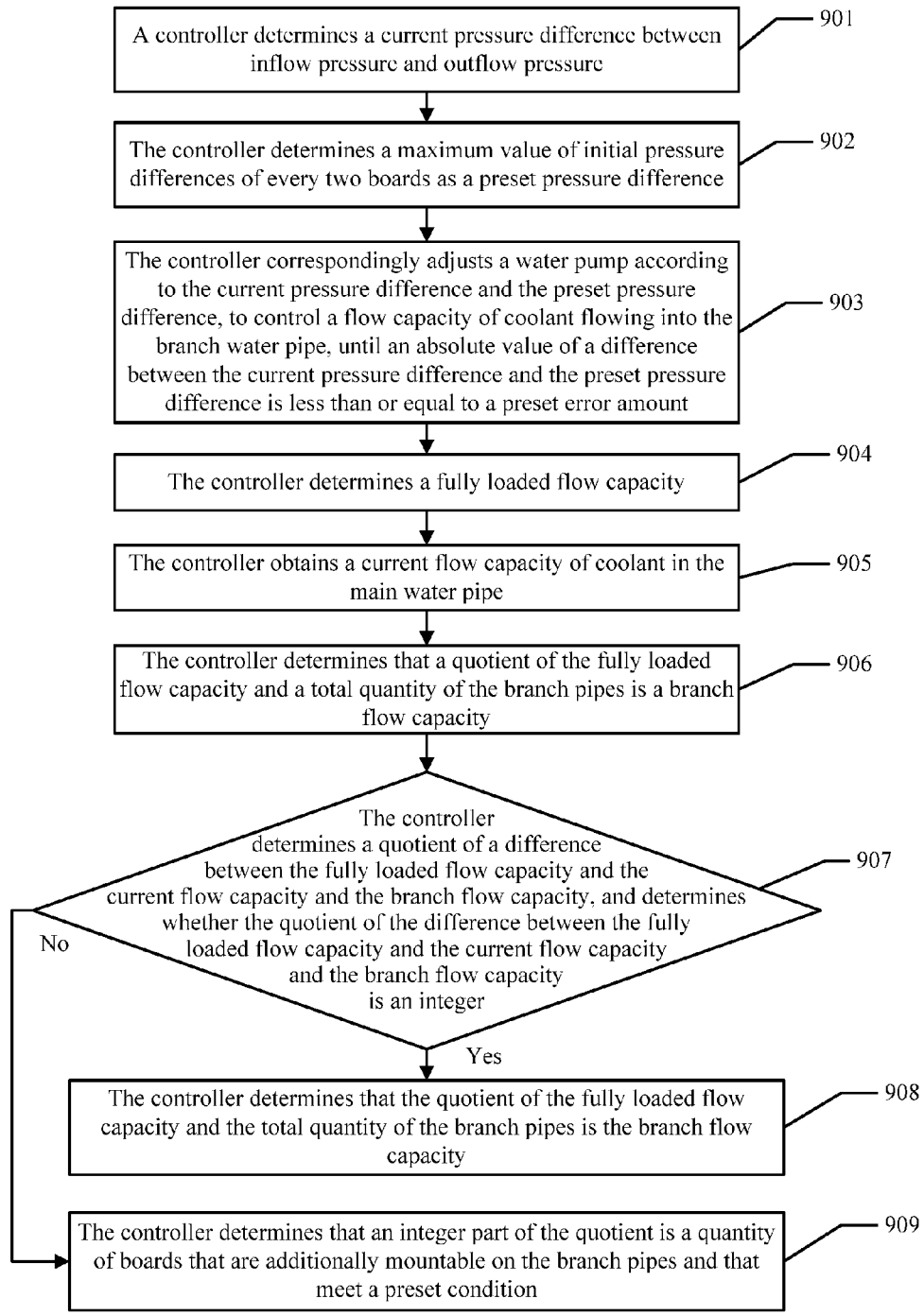
FIG. 9 is a flowchart of steps in another embodiment of a heat dissipation method according to an embodiment of the present disclosure.

Detailed descriptions on the heat dissipation control method based on the heat dissipation apparatus are provided in the embodiment shown in FIG. 6. The following describes, with reference to an embodiment shown in FIG. 9, how a heat dissipation apparatus determines a quantity of boards additionally mountable on the heat dissipation apparatus.

For a specific structure of the heat dissipation apparatus shown in this embodiment, refer to the embodiments shown in FIG. 1 to FIG. 5, and details are not described in this embodiment.

901: The controller determines a current pressure difference between inflow pressure and outflow pressure.

Figure 7:
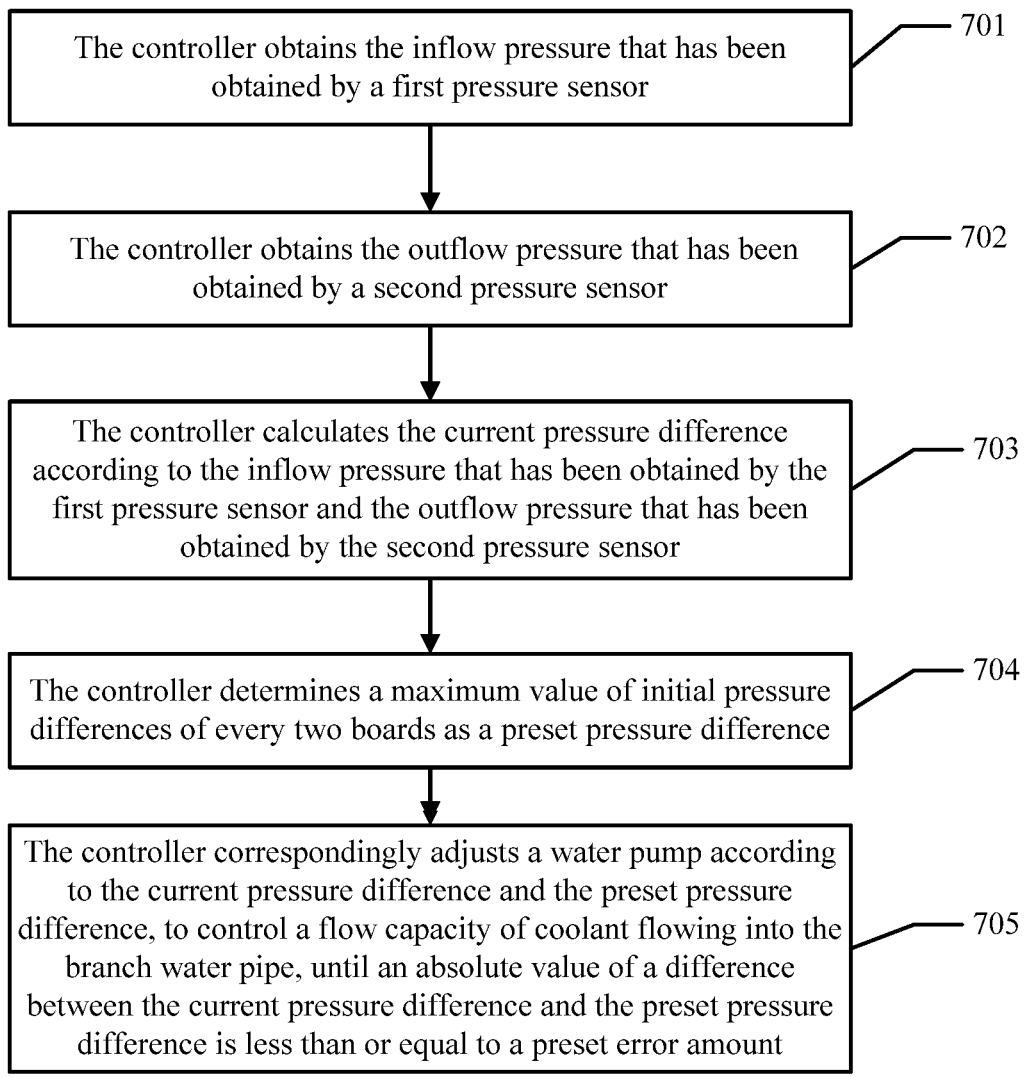
FIG. 7 is a flowchart of steps in another embodiment of a heat dissipation method according to an embodiment of the present disclosure.
Figure 8:
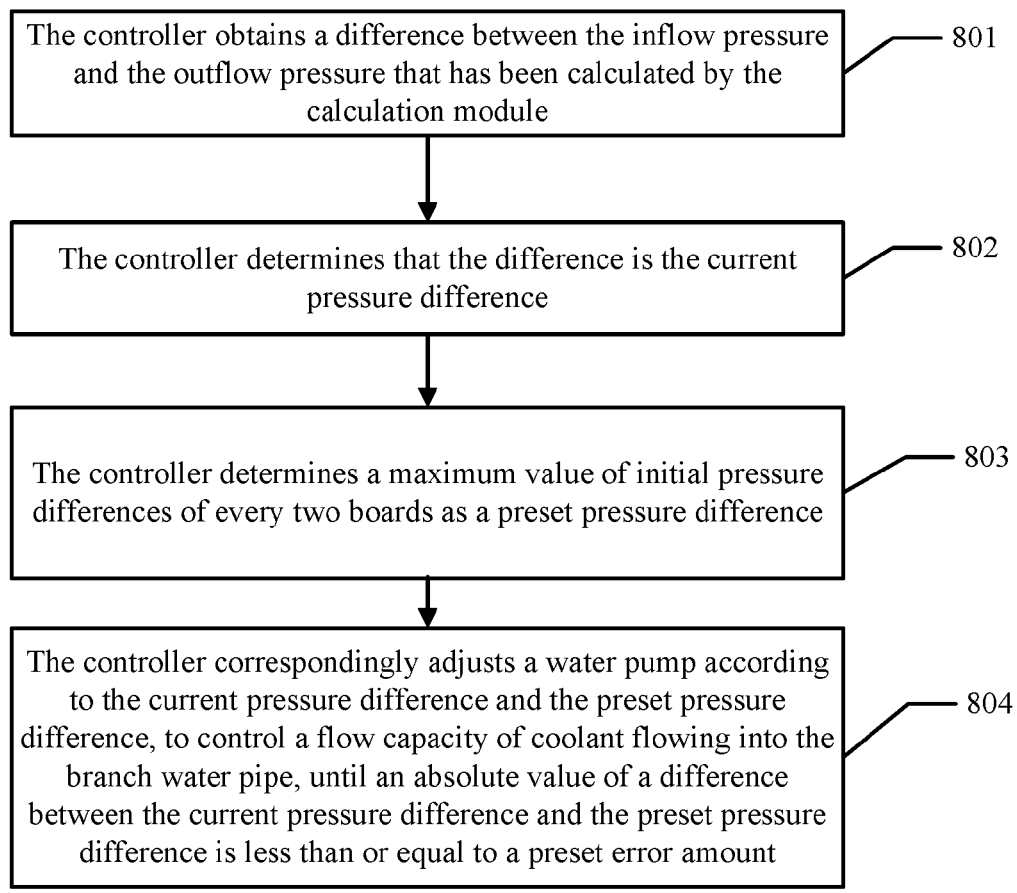
FIG. 8 is a flowchart of steps in another embodiment of a heat dissipation method according to an embodiment of the present disclosure.

For a specific process of determining the current pressure difference in step 901 in this embodiment, refer to the embodiment shown in FIG. 7 or the embodiment shown in FIG. 8, and in this embodiment, no limitation is imposed on a specific manner of determining a current pressure difference.

902: The controller determines a maximum value of initial pressure differences of every two boards as a preset pressure difference.

903: The controller correspondingly adjusts a water pump according to the current pressure difference and the preset pressure difference, to control a flow capacity of coolant flowing into the branch water pipe, until an absolute value of a difference between the current pressure difference and the preset pressure difference is less than or equal to a preset error amount.

In this embodiment, processes of step 902 and step 903 are the same as those of step 602 and step 603 that are shown in FIG. 6, and details are not described in this embodiment.

904: The controller determines a fully loaded flow capacity.

The fully loaded flow capacity is a flow capacity, of coolant in the main water pipe, existing when the absolute value of the difference between the current pressure difference and the preset pressure difference is less than or equal to the preset error amount and a board that meets a preset condition is mounted on each of the branch pipes.

The preset condition is that the initial pressure difference that has been set for the board mounted on the branch pipe is less than or equal to the preset pressure difference.

For a specific process in which the controller determines the fully loaded flow capacity, refer to the embodiment shown in FIG. 4.

905: The controller obtains a current flow capacity of coolant in the main water pipe.

The current flow capacity is obtained by a flowmeter disposed on the inflow pipe or the backflow pipe.

For a specific manner of obtaining the current flow capacity of the coolant in the main water pipe by the controller, refer to the embodiment shown in FIG. 4.

906: The controller determines that a quotient of the fully loaded flow capacity and a total quantity of the branch pipes is a branch flow capacity.

907: The controller determines a quotient of a difference between the fully loaded flow capacity and the current flow capacity and the branch flow capacity, and determines whether the quotient of the difference between the fully loaded flow capacity and the current flow capacity and the branch flow capacity is an integer; and if yes, perform step 908, or if no, perform step 909.

908: The controller determines that the quotient is a quantity of boards that are additionally mountable on the branch pipes and that meet the preset condition.

909: The controller determines that an integer part of the quotient is a quantity of boards that are additionally mountable on the branch pipes and that meet the preset condition.

For details about how the controller determines the quantity of boards that are additionally mountable on the branch pipes and that meet the preset condition, refer to the embodiment shown in FIG. 4.

When the quantity of boards additionally mountable on the heat dissipation apparatus is determined in this embodiment of the present disclosure, a manner of directly reading the quantity by the controller may also be used, which is as follows. A management unit is pre-established on a device side; the management unit may detect whether a board is mounted on a branch board, collect statistics on a quantity of mounted boards, and display the quantity using a monitoring board; a coupling relationship between the controller located within the heat dissipation apparatus and the management unit is pre-established; and the controller may read content reported by the monitoring board, to determine a quantity of branch boards on which boards are mounted, so that the controller accurately controls the flow capacity.

Figure 10:
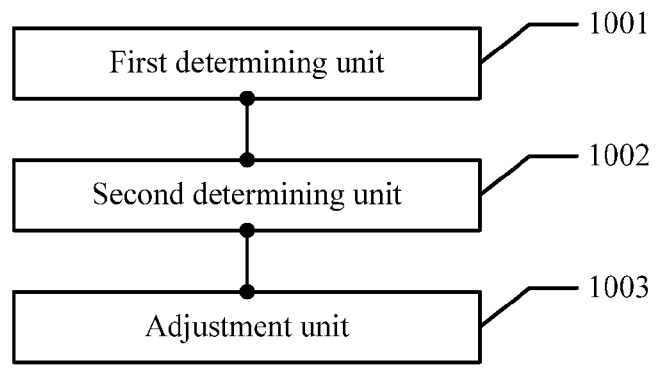
FIG. 10 is a schematic structural diagram of an embodiment of a controller according to an embodiment of the present disclosure.

The following describes, with reference to an embodiment shown in FIG. 10, in detail a specific structure of a controller according to the present disclosure.

As shown in FIG. 10, the controller includes a first determining unit 1001 configured to determine a current pressure difference between inflow pressure and outflow pressure, where the inflow pressure is pressure of coolant flowing into a branch water pipe, the outflow pressure is pressure of coolant flowing out of the branch water pipe, the inflow pressure and the outflow pressure are obtained by a sensor, and the branch water pipe is configured to cool a board mounted on the branch water pipe; a second determining unit 1002 configured to determine a maximum value of initial pressure differences of every two boards as a preset pressure difference, where the initial pressure difference is a pressure difference required for ensuring that each component on the board runs without derating; and an adjustment unit 1003 configured to correspondingly adjust a water pump according to the current pressure difference and the preset pressure difference, to control a flow capacity of the coolant flowing into the branch water pipe, until an absolute value of a difference between the current pressure difference and the preset pressure difference is less than or equal to a preset error amount, where the water pump is disposed on a main water pipe connected to the branch water pipe.

Detailed descriptions on the specific structure of the controller according to the present disclosure are provided in the embodiment shown in FIG. 10. The following describes, with reference to an embodiment shown in FIG. 11, a specific structure of a controller that can determine the current pressure difference using a pressure sensor.

The main water pipe in this embodiment includes an inflow pipe and a backflow pipe.

The branch water pipe includes a flow dividing pipe, a flow collecting pipe, and multiple parallelly disposed branch pipes.

The flow dividing pipe is connected to both the inflow pipe and the branch pipes, so that coolant in the inflow pipe flows into the branch pipes evenly through the flow dividing pipe.

The flow collecting pipe is connected to both the backflow pipe and the branch pipes, so that coolant in the branch pipes flows into the backflow pipe evenly through the flow collecting pipe.

The sensor includes a first pressure sensor and a second pressure sensor.

The first pressure sensor is disposed on the inflow pipe or the flow dividing pipe, and is configured to obtain inflow pressure of coolant flowing into the flow dividing pipe.

The second pressure sensor is disposed on the backflow pipe or the flow collecting pipe, and is configured to obtain outflow pressure of coolant flowing out of the flow collecting pipe.

For details, refer to the embodiment shown in FIG. 2.

Figure 11:
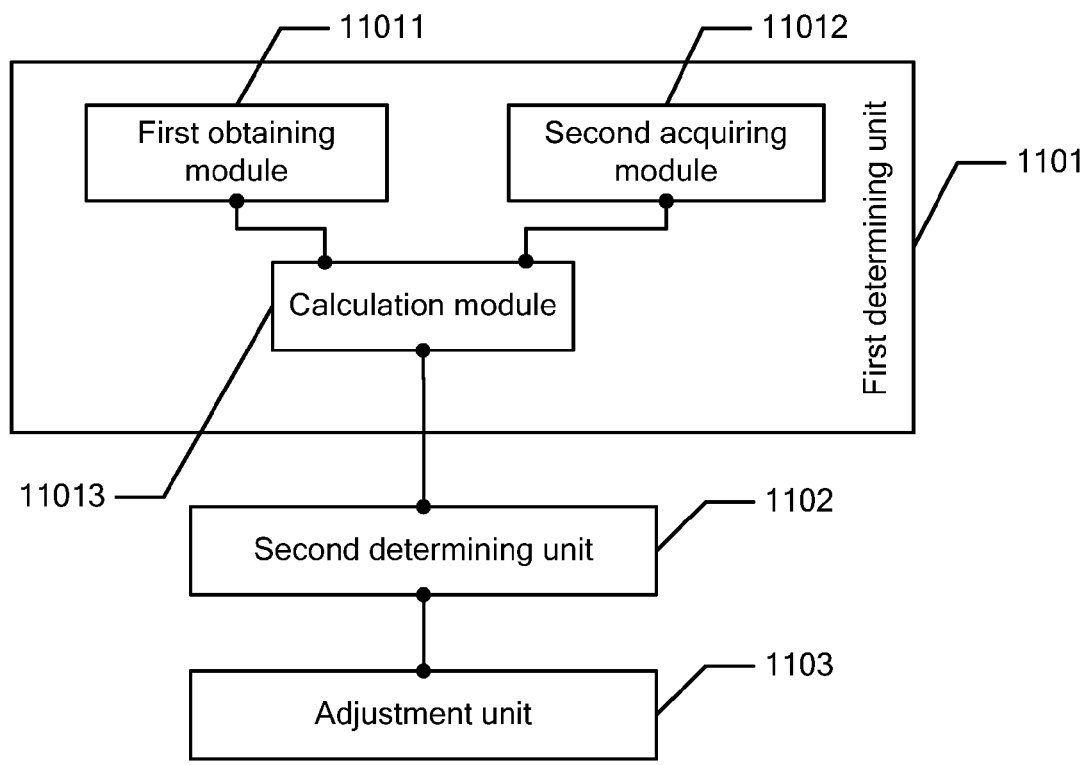
FIG. 11 is a schematic structural diagram of another embodiment of a controller according to an embodiment of the present disclosure.

As shown in FIG. 11, the controller includes a first determining unit 1101 configured to determine a current pressure difference between the inflow pressure and the outflow pressure, where the inflow pressure is pressure of coolant flowing into the branch water pipe, the outflow pressure is pressure of coolant flowing out of the branch water pipe, the inflow pressure and the outflow pressure are obtained by the sensor, and the branch water pipe is configured to cool a board mounted on the branch water pipe; a second determining unit 1102 configured to determine a maximum value of initial pressure differences of every two boards as a preset pressure difference, where the initial pressure difference is a pressure difference required for ensuring that each component on the board runs without derating; and an adjustment unit 1103 configured to correspondingly adjust a water pump according to the current pressure difference and the preset pressure difference, to control a flow capacity of the coolant flowing into the branch water pipe, until an absolute value of a difference between the current pressure difference and the preset pressure difference is less than or equal to a preset error amount, where the water pump is disposed on the main water pipe connected to the branch water pipe.

The first determining unit 1101 includes a first obtaining module 11011 configured to obtain the inflow pressure that has been obtained by the first pressure sensor, where the first pressure sensor is configured to obtain the inflow pressure; a second obtaining module 11012 configured to obtain the outflow pressure that has been obtained by the second pressure sensor, where the second pressure sensor is configured to obtain the outflow pressure; and a calculation module 11013 configured to calculate the current pressure difference according to the inflow pressure that has been obtained by the first pressure sensor and the outflow pressure that has been obtained by the second pressure sensor.

Detailed descriptions on the specific structure of the controller according to the present disclosure are provided in the embodiment shown in FIG. 10. The following describes, with reference to an embodiment shown in FIG. 12, a specific structure of a controller that can determine the current pressure difference using a differential pressure sensor.

The main water pipe includes an inflow pipe and a backflow pipe.

The branch water pipe includes a flow dividing pipe, a flow collecting pipe, and multiple parallelly disposed branch pipes.

The flow dividing pipe is connected to both the inflow pipe and the branch pipes, so that coolant in the inflow pipe flows into the branch pipes evenly through the flow dividing pipe.

The flow collecting pipe is connected to both the backflow pipe and the branch pipes, so that coolant in the branch pipes flows into the backflow pipe evenly through the flow collecting pipe.

The sensor is a differential pressure sensor, and the differential pressure sensor includes a first pressure interface, a second pressure interface, and a calculation module, where the first pressure interface is disposed on the inflow pipe, and is configured to obtain inflow pressure of coolant flowing into the flow dividing pipe; the second pressure interface is disposed on the backflow pipe, and is configured to obtain outflow pressure of coolant flowing out of the flow collecting pipe; and the first calculation module is connected to both the first pressure interface and the second pressure interface, and the first calculation module is configured to calculate a difference between the inflow pressure and the outflow pressure.

For details, refer to the embodiment shown in FIG. 2.

Figure 12:
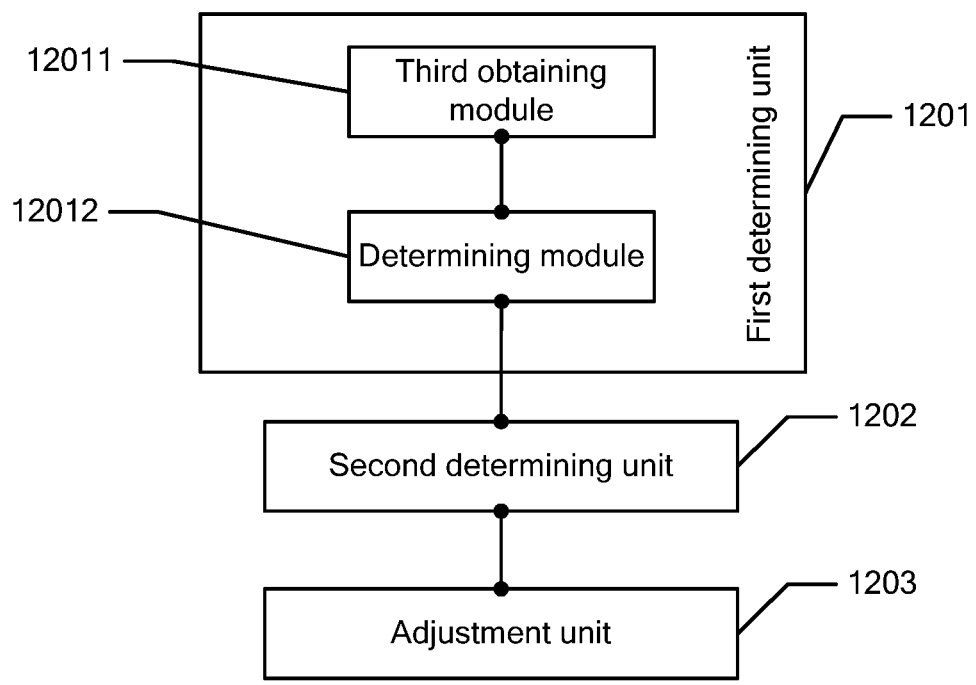
FIG. 12 is a schematic structural diagram of another embodiment of a controller according to an embodiment of the present disclosure.

As shown in FIG. 12, the controller includes a first determining unit 1201 configured to determine a current pressure difference between the inflow pressure and the outflow pressure, where the inflow pressure is pressure of coolant flowing into the branch water pipe, the outflow pressure is pressure of coolant flowing out of the branch water pipe, the inflow pressure and the outflow pressure are obtained by the sensor, and the branch water pipe is configured to cool a board mounted on the branch water pipe; a second determining unit 1202 configured to determine a maximum value of initial pressure differences of every two boards as a preset pressure difference, where the initial pressure difference is a pressure difference required for ensuring that each component on the board runs without derating; and an adjustment unit 1203 configured to correspondingly adjust a water pump according to the current pressure difference and the preset pressure difference, to control a flow capacity of the coolant flowing into the branch water pipe, until an absolute value of a difference between the current pressure difference and the preset pressure difference is less than or equal to a preset error amount, where the water pump is disposed on the main water pipe connected to the branch water pipe.

The first determining unit 1201 includes a third obtaining module 12011 configured to obtain the difference between the inflow pressure and the outflow pressure that has been calculated by the calculation module; and a determining module 12012 configured to determine that the difference is the current pressure difference.

Detailed descriptions on the specific structure of the controller according to the present disclosure are provided in the embodiment shown in FIG. 10. The following describes, with reference to an embodiment shown in FIG. 13, a specific structure of a controller that can estimate a quantity of boards additionally mountable on branch pipes.

The main water pipe in this embodiment includes an inflow pipe and a backflow pipe.

The branch water pipe includes a flow dividing pipe, a flow collecting pipe, and multiple parallelly disposed branch pipes.

The flow dividing pipe is connected to both the inflow pipe and the branch pipes, so that coolant in the inflow pipe flows into the branch pipes evenly through the flow dividing pipe.

The flow collecting pipe is connected to both the backflow pipe and the branch pipes, so that coolant in the branch pipes flows into the backflow pipe evenly through the flow collecting pipe.

For details, refer to the embodiment shown in FIG. 2.

Figure 13:
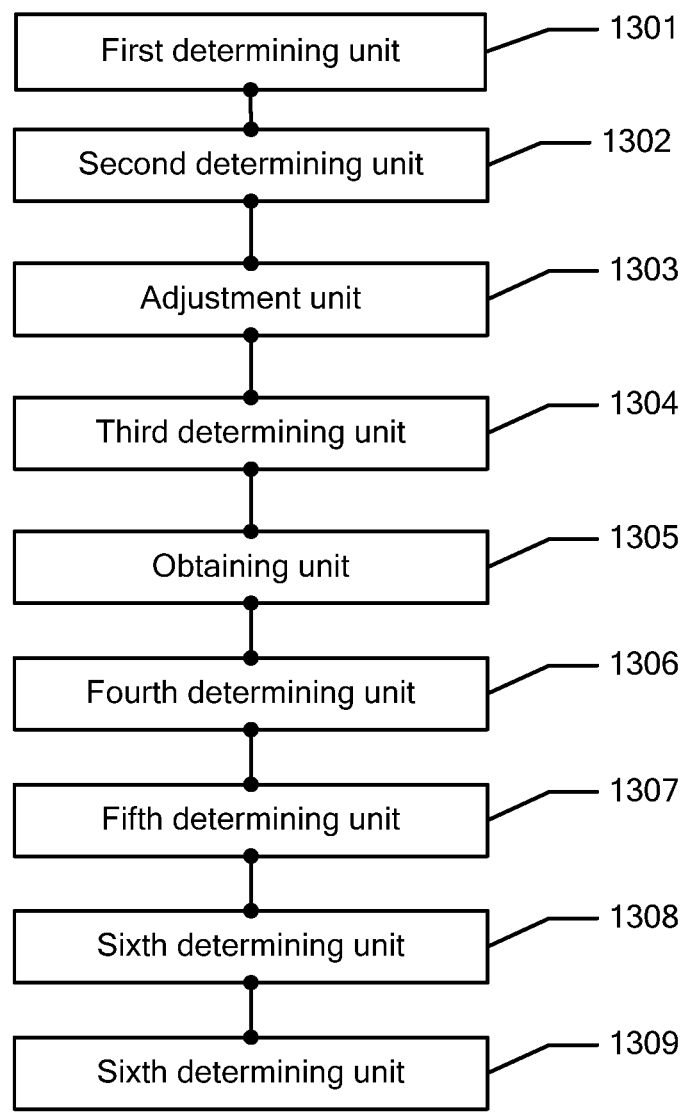
FIG. 13 is a schematic structural diagram of another embodiment of a controller according to an embodiment of the present disclosure.

As shown in FIG. 13, the controller includes a first determining unit 1301 configured to determine a current pressure difference between inflow pressure and outflow pressure, where the inflow pressure is pressure of coolant flowing into the branch water pipe, the outflow pressure is pressure of coolant flowing out of the branch water pipe, the inflow pressure and the outflow pressure are obtained by a sensor, and the branch water pipe is configured to cool a board mounted on the branch water pipe; a second determining unit 1302 configured to determine a maximum value of initial pressure differences of every two boards as a preset pressure difference, where the initial pressure difference is a pressure difference required for ensuring that each component on the board runs without derating; and an adjustment unit 1303 configured to correspondingly adjust a water pump according to the current pressure difference and the preset pressure difference, to control a flow capacity of the coolant flowing into the branch water pipe, until an absolute value of a difference between the current pressure difference and the preset pressure difference is less than or equal to a preset error amount, where the water pump is disposed on the main water pipe connected to the branch water pipe; a third determining unit 1304 configured to determine a fully loaded flow capacity, where the fully loaded flow capacity is a flow capacity, of coolant in the main water pipe, existing when the absolute value of the difference between the current pressure difference and the preset pressure difference is less than or equal to the preset error amount and a board that meets a preset condition is mounted on each of the branch pipes, and the preset condition is that the initial pressure difference that has been set for the board mounted on the branch pipe is less than or equal to the preset pressure difference; an obtaining unit 1305 configured to obtain a current flow capacity of the coolant in the main water pipe, where the current flow capacity is obtained by a flowmeter disposed on the inflow pipe or the backflow pipe; a fourth determining unit 1306 configured to determine that a quotient of the fully loaded flow capacity and a total quantity of the branch pipes is a branch flow capacity; a fifth determining unit 1307 configured to determine a quotient of a difference between the fully loaded flow capacity and the current flow capacity and the branch flow capacity; and determine whether the quotient of the difference between the fully loaded flow capacity and the current flow capacity and the branch flow capacity is an integer; and a sixth determining unit 1308 configured to, if the fifth determining unit determines that the quotient of the difference between the fully loaded flow capacity and the current flow capacity and the branch flow capacity is an integer, determine that the quotient is a quantity of boards that are additionally mountable on the branch pipes and that meet the preset condition; or a seventh determining unit 1309 configured to, if the fifth determining unit determines that the quotient of the difference between the fully loaded flow capacity and the current flow capacity, and the branch flow capacity is not an integer, determine that an integer part of the quotient is a quantity of boards that are additionally mountable on the branch pipes and that meet the preset condition.

The foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present disclosure.

What is claimed is:

1. A heat dissipation apparatus, comprising:
a main water pipe;
a heat exchanger connected to the main water pipe;
a plurality of branch water pipes connected to the main water pipe, each branch water pipe of the plurality of branch water pipes configured to cool a board of a plurality of boards mounted on the branch water pipe;
a water pump disposed on the main water pipe;
a sensor disposed on the main water pipe or on one or more of the plurality of branch water pipes, the sensor configured to obtain inflow pressure of coolant flowing into the plurality of branch water pipes and outflow pressure of coolant flowing out of the plurality of branch water pipes; and
a controller connected to the sensor and the water pump, the controller configured to:
determine a preset pressure difference, the preset pressure difference a maximum value of initial pressure differences of the plurality of boards, the initial pressure differences predetermined to ensure that each component on each board of the plurality of boards runs without derating;
determine a current pressure difference between the inflow pressure and the outflow pressure; and
adjust the water pump to control a flow capacity of the coolant flowing into the plurality of branch water pipes until an absolute value of a difference between the current pressure difference and the preset pressure difference is less than or equal to a preset error amount.

2. The heat dissipation apparatus of claim 1, wherein a value range of the preset error amount is greater than or equal to 0, and is less than or equal to 10% of the preset pressure difference.

3. The heat dissipation apparatus of claim 1, wherein the main water pipe comprises an inflow pipe and a backflow pipe, wherein the plurality of branch water pipes comprises a flow dividing pipe, a flow collecting pipe, and parallel branch pipes, wherein the flow dividing pipe is connected to both the inflow pipe and the parallel branch pipes such that coolant in the inflow pipe flows into the parallel branch pipes through the flow dividing pipe, and wherein the flow collecting pipe is connected to both the backflow pipe and the parallel branch pipes such that coolant in the parallel branch pipes flows into the backflow pipe through the flow collecting pipe.

4. The heat dissipation apparatus of claim 3, wherein the sensor is a pressure sensor or a differential pressure sensor.

5. The heat dissipation apparatus of claim 4, wherein the pressure sensor comprises a first pressure sensor and a second pressure sensor, wherein the first pressure sensor is disposed on the inflow pipe or the flow dividing pipe, and is configured to obtain inflow pressure of coolant flowing into the flow dividing pipe, wherein the second pressure sensor is disposed on the backflow pipe or the flow collecting pipe, and is configured to obtain outflow pressure of coolant flowing out of the flow collecting pipe, wherein the controller is connected to both the first pressure sensor and the second pressure sensor, and wherein the controller is configured to calculate the current pressure difference according to the inflow pressure that has been obtained by the first pressure sensor and the outflow pressure that has been obtained by the second pressure sensor.

6. The heat dissipation apparatus of claim 4, wherein the differential pressure sensor comprises a first pressure interface, a second pressure interface, and a calculation module, wherein the first pressure interface is disposed on the inflow pipe or the flow dividing pipe, and is configured to obtain inflow pressure of coolant flowing into the flow dividing pipe, wherein the second pressure interface is disposed on the backflow pipe or the flow collecting pipe, and is configured to obtain outflow pressure of coolant flowing out of the flow collecting pipe, wherein the calculation module is connected to both the first pressure interface and the second pressure interface, wherein the calculation module is configured to calculate a difference between the inflow pressure and the outflow pressure, wherein the controller is connected to the differential pressure sensor, wherein the controller is configured to obtain the difference between the inflow pressure and the outflow pressure that has been calculated by the calculation module, and wherein the difference is the current pressure difference.

7. The heat dissipation apparatus according to claim 3, wherein a flowmeter is disposed on the inflow pipe or the backflow pipe, wherein the flowmeter is configured to obtain a current flow capacity of coolant in the main water pipe, wherein the controller is connected to the flowmeter, wherein the controller is configured to determine a fully loaded flow capacity, wherein the fully loaded flow capacity is a flow capacity of the coolant in the main water pipe, existing when the absolute value of the difference between the current pressure difference and the preset pressure difference is less than or equal to the preset error amount and a board that meets a preset condition is mounted on each of the branch pipes, wherein the preset condition is that the initial pressure difference that has been set for the board mounted on the branch pipe is less than or equal to the preset pressure difference, wherein the controller is further configured to obtain the current flow capacity and determine that a quotient of the fully loaded flow capacity and a total quantity of the branch pipes is a branch flow capacity, wherein the controller determines a quotient of a difference between the fully loaded flow capacity and the current flow capacity and the branch flow capacity, and determines whether the quotient of the difference between the fully loaded flow capacity and the current flow capacity and the branch flow capacity is an integer, and wherein when the quotient of the difference between the fully loaded flow capacity and the current flow capacity and the branch flow capacity is an integer, the controller determines that the quotient is a quantity of boards that are additionally mountable on the branch pipes and that meet the preset condition.

8. The heat dissipation apparatus according to claim 3, wherein a flowmeter is disposed on the inflow pipe or the backflow pipe, wherein the flowmeter is configured to obtain a current flow capacity of coolant in the main water pipe, wherein the controller is connected to the flowmeter, wherein the controller is configured to determine a fully loaded flow capacity, wherein the fully loaded flow capacity is a flow capacity of the coolant in the main water pipe, existing when the absolute value of the difference between the current pressure difference and the preset pressure difference is less than or equal to the preset error amount and a board that meets a preset condition is mounted on each of the branch pipes, wherein the preset condition is that the initial pressure difference that has been set for the board mounted on the branch pipe is less than or equal to the preset pressure difference, wherein the controller is further configured to obtain the current flow capacity and determine that a quotient of the fully loaded flow capacity and a total quantity of the branch pipes is a branch flow capacity, wherein the controller determines a quotient of a difference between the fully loaded flow capacity and the current flow capacity and the branch flow capacity, and determines whether the quotient of the difference between the fully loaded flow capacity and the current flow capacity and the branch flow capacity is an integer, and when the quotient of the difference between the fully loaded flow capacity and the current flow capacity and the branch flow capacity is not an integer, the controller determines that an integer part of the quotient is a quantity of boards that are additionally mountable on the branch pipes and that meet the preset condition.

9. A heat dissipation control method, comprising:
   determining, by a controller, a preset pressure difference, the preset pressure difference a maximum value of initial pressure differences of a plurality of boards, the initial pressure differences predetermined to ensure that each component on each board of the plurality of boards runs without derating;
   receiving, by the controller from a sensor, an inflow pressure of coolant flowing into a plurality of branch water pipes and an outflow pressure of coolant flowing out of the plurality of branch water pipes, the plurality of branch water pipes connected to a main water pipe, each branch water pipe of the plurality of branch water pipes configured to cool a board of a plurality of boards mounted on the branch water pipe;
   determining, by a controller, a current pressure difference between the inflow pressure and the outflow pressure; and
   adjusting, by the controller, a water pump to control a flow capacity of the coolant flowing into the plurality of branch water pipes until an absolute value of a difference between the current pressure difference and the preset pressure difference is less than or equal to a preset error amount.

10. The heat dissipation control method of claim 9, wherein the sensor comprises a first pressure sensor disposed on an inflow pipe of the main water pipe or a flow dividing pipe of the plurality of branch water pipes and a second pressure sensor disposed on a backflow pipe of the main water pipe or a flow collecting pipe of the plurality of branch water pipes, and wherein determining, by the controller, the current pressure difference between inflow pressure and outflow pressure comprises:

obtaining, by the controller, the inflow pressure from the first pressure sensor;

obtaining, by the controller, the outflow pressure from the second pressure sensor; and calculating, by the controller, the current pressure difference according to the inflow pressure that has been obtained by the first pressure sensor and the outflow pressure that has been obtained by the second pressure sensor.

11. The heat dissipation control method of claim 9, wherein the sensor is a differential pressure sensor comprising a first pressure interface, a second pressure interface, and a calculation module, the first pressure interface disposed on an inflow pipe of the main water pipe, the second pressure interface disposed on a backflow pipe of the main water pipe, and is configured to obtain outflow pressure of coolant flowing out of the flow collecting pipe, and wherein determining, by the controller, the current pressure difference between the inflow pressure and the outflow pressure comprises:

obtaining, by the controller, a difference between the inflow pressure and the outflow pressure from the calculation module; and determining, by the controller, that the difference is the current pressure difference.

12. The heat dissipation control method according to claim 9, wherein the main water pipe comprises an inflow pipe and a backflow pipe, wherein the branch water pipe comprises a flow dividing pipe, a flow collecting pipe, and multiple parallelly disposed branch pipes, wherein the flow dividing pipe is connected to both the inflow pipe and the branch pipes such that coolant in the inflow pipe flows into the branch pipes evenly through the flow dividing pipe, wherein the flow collecting pipe is connected to both the backflow pipe and the branch pipes such that coolant in the branch pipes flows into the backflow pipe evenly through the flow collecting pipe, and wherein the method further comprises:

determining, by the controller, a fully loaded flow capacity, wherein the fully loaded flow capacity is a flow capacity, of coolant in the main water pipe, existing when the absolute value of the difference between the current pressure difference and the preset pressure difference is less than or equal to the preset error amount and a board that meets a preset condition is mounted on each of the branch pipes, and wherein the preset condition is that the initial pressure difference that has been set for the board mounted on the branch pipe is less than or equal to the preset pressure difference;

obtaining, by the controller, a current flow capacity of the coolant in the main water pipe, wherein the current flow capacity is obtained by a flowmeter disposed on the inflow pipe or the backflow pipe;

determining, by the controller, that a quotient of the fully loaded flow capacity and a total quantity of the branch pipes is a branch flow capacity;

determining, by the controller, a quotient of a difference between the fully loaded flow capacity and the current flow capacity and the branch flow capacity; and determining whether the quotient of the difference between the fully loaded flow capacity and the current flow capacity and the branch flow capacity is an integer;

determining, by the controller, that the quotient is a quantity of boards that are additionally mountable on the branch pipes and that meet the preset condition when the quotient of the difference between the fully loaded flow capacity and the current flow capacity and the branch capacity is the integer; and determining, by the controller, that an integer part of the quotient is a quantity of boards that are additionally mountable on the branch pipes and that meet the preset condition when the quotient of the difference between the fully loaded flow capacity and the current flow capacity and the branch capacity is not the integer.

13. A controller comprising:

a non-transitory computer readable medium having instructions stored thereon; and a computer processor coupled to the non-transitory computer readable medium and configured to execute the instructions to:

determine a preset pressure difference, the preset pressure difference a maximum value of initial pressure differences of a plurality of boards, the initial pressure differences predetermined to ensure that each component on each board of the plurality of boards runs without derating;

receive, from a sensor, an inflow pressure of coolant flowing into a plurality of branch water pipes and an outflow pressure of coolant flowing out of the plurality of branch water pipes, the plurality of branch water pipes connected to a main water pipe, each branch water pipe of the plurality of branch water pipes configured to cool a board of a plurality of boards mounted on the branch water pipe;

determine a current pressure difference between the inflow pressure and the outflow pressure; and adjust a water pump to control a flow capacity of the coolant flowing into the plurality of branch water pipes until an absolute value of a difference between the current pressure difference and the preset pressure difference is less than or equal to a preset error amount.

14. The controller of claim 13, wherein the sensor comprises a first pressure sensor disposed on an inflow pipe of the main water pipe or a flow dividing pipe of the plurality of branch water pipes and a second pressure sensor disposed on a backflow pipe of the main water or a flow collecting pipe of the plurality of branch water pipes, and wherein the computer processor is further configured to execute the instructions to:

obtain the inflow pressure from the first pressure sensor;

obtain the outflow pressure from the second pressure sensor; and calculate the current pressure difference according to the inflow pressure that has been obtained by the first pressure sensor and the outflow pressure that has been obtained by the second pressure sensor.

15. The controller of claim 13, wherein the sensor is a differential pressure sensor comprising a first pressure interface, a second pressure interface, and a calculation module, the first pressure interface disposed on an inflow pipe of the main water pipe, the second pressure interface disposed on a backflow pipe of the main water pipe, and wherein the computer processor is further configured to execute the instructions to:

obtain a difference between the inflow pressure and the outflow pressure from the calculation module; and determine that the difference is the current pressure difference.

16. The controller according to claim 13, wherein the main water pipe comprises an inflow pipe and a backflow pipe, wherein the branch water pipe comprises a flow dividing pipe, a flow collecting pipe, and multiple parallelly disposed branch pipes, wherein the flow dividing pipe is connected to both the inflow pipe and the branch pipes such that coolant in the inflow pipe flows into the branch pipes evenly through the flow dividing pipe, wherein the flow collecting pipe is connected to both the backflow pipe and the branch pipes such that coolant in the branch pipes flows into the backflow pipe evenly through the flow collecting pipe, and wherein the processor is further configured to execute the instructions to:

determine a fully loaded flow capacity, wherein the fully loaded flow capacity is a flow capacity of coolant in the main water pipe, existing when the absolute value of the difference between the current pressure difference and the preset pressure difference is less than or equal to the preset error amount and a board that meets a preset condition is mounted on each of the branch pipes, wherein the preset condition is that the initial pressure difference that has been set for the board mounted on the branch pipe is less than or equal to the preset pressure difference;

obtain a current flow capacity of the coolant in the main water pipe, wherein the current flow capacity is obtained by a flowmeter disposed on the inflow pipe or the backflow pipe;

determine that a quotient of the fully loaded flow capacity and a total quantity of the branch pipes is a branch flow capacity;

determine a quotient of a difference between the fully loaded flow capacity and the current flow capacity and the branch flow capacity;

determine whether the quotient of the difference between the fully loaded flow capacity and the current flow capacity and the branch flow capacity is an integer;

determine that the quotient is a quantity of boards that are additionally mountable on the branch pipes and that meet the preset condition when the quotient of the difference between the fully loaded flow capacity and the current flow capacity and the branch flow capacity is the integer; and determine that an integer part of the quotient is a quantity of boards that are additionally mountable on the branch pipes and that meet the preset condition when the quotient of the difference between the fully loaded flow capacity and the current flow capacity and the branch flow capacity is not the integer.

\* \* \* \* \*